(12) United States Patent
Kuo et al.

(10) Patent No.: US 10,680,109 B2
(45) Date of Patent: Jun. 9, 2020

(54) CMOS SEMICONDUCTOR DEVICE HAVING FINS AND METHOD OF FABRICATING THE SAME

(71) Applicant: TAIWAN SEMICONDUCTOR MANUFACTURING CO., LTD., Hsinchu (TW)

(72) Inventors: Shu-Hao Kuo, Tainan (TW); Jung-Hao Chang, Taichung (TW); Chao-Hsien Huang, Tainan (TW); Li-Te Lin, Hsinchu (TW); Kuo-Cheng Ching, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/141,509

(22) Filed: Sep. 25, 2018

(65) Prior Publication Data

US 2019/0097056 A1  Mar. 28, 2019

Related U.S. Application Data

(60) Provisional application No. 62/565,020, filed on Sep. 28, 2017.

(51) Int. Cl.
| | |
|---|---|
| *H01L 29/66* | (2006.01) |
| *H01L 29/417* | (2006.01) |
| *H01L 21/8238* | (2006.01) |
| *H01L 27/092* | (2006.01) |
| *H01L 29/78* | (2006.01) |
| *H01L 27/12* | (2006.01) |
| *H01L 21/84* | (2006.01) |
| *H01L 21/306* | (2006.01) |
| *H01L 29/06* | (2006.01) |
| *H01L 21/762* | (2006.01) |

(Continued)

(52) U.S. Cl.
CPC ...... *H01L 29/7853* (2013.01); *H01L 21/3065* (2013.01); *H01L 21/30604* (2013.01); *H01L 21/31116* (2013.01); *H01L 21/76229* (2013.01); *H01L 21/823821* (2013.01); *H01L 21/845* (2013.01); *H01L 27/0924* (2013.01); *H01L 27/1211* (2013.01); *H01L 29/0649* (2013.01); *H01L 29/41791* (2013.01); *H01L 29/66795* (2013.01); *H01L 29/66803* (2013.01); *H01L 21/0262* (2013.01); *H01L 21/02532* (2013.01); *H01L 2029/7858* (2013.01)

(58) Field of Classification Search
CPC .......... H01L 29/7853; H01L 29/41791; H01L 29/66795; H01L 21/823821; H01L 27/0924
USPC .......................... 257/327; 438/199, 221, 222
See application file for complete search history.

(56) References Cited

U.S. PATENT DOCUMENTS 9,991,262 B1 * 6/2018 Ching ............... H01L 29/045
2017/0141220 A1 * 5/2017 Ching ............... H01L 29/0649

(Continued)

*Primary Examiner* — Robert T Huber
(74) *Attorney, Agent, or Firm* — Maschoff Brennan

(57) ABSTRACT

A device includes a semiconductor substrate, a first fin arranged over the semiconductor substrate, and an isolation structure. The first fin includes an upper portion, a bottom portion, and an insulator layer between the upper portion and the bottom portion. A top surface of the insulator layer is wider than a bottom surface of the upper portion of the first fin. The isolation structure surrounds the bottom portion of the first fin.

20 Claims, 21 Drawing Sheets

(51) Int. Cl.
*H01L 21/3065* (2006.01)
*H01L 21/311* (2006.01)
*H01L 21/02* (2006.01)

(56) References Cited

U.S. PATENT DOCUMENTS

2017/0154973 A1* 6/2017 Ching ................ H01L 29/41791
2019/0006391 A1* 1/2019 Shen ................... H01L 27/0924

* cited by examiner

CMOS SEMICONDUCTOR DEVICE HAVING FINS AND METHOD OF FABRICATING THE SAME

CROSS-REFERENCE TO RELATED APPLICATION

This application claims priority to U.S. Provisional Application Ser. No. 62/565,020, filed Sep. 28, 2017, which is herein incorporated by reference in its entirety.

BACKGROUND

The semiconductor industry has progressed into nanometer technology process nodes in pursuit of higher device density, higher performance, and lower costs. As this progression has taken place, challenges stemming from both fabrication and design issues have resulted in the development of three-dimensional designs, such as the fin-like field effect transistor (FinFET) device. A typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow.

However, as FinFET devices scale down, a risk of scaling fin width is that this may result in a short channel effect, causing serious mobility degradation. Therefore, to facilitate the scaling of complementary metal-oxide-semiconductor (CMOS) dimensions while maintaining an acceptable performance, there is a need to increase the mobility of carriers in a semiconductor material.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
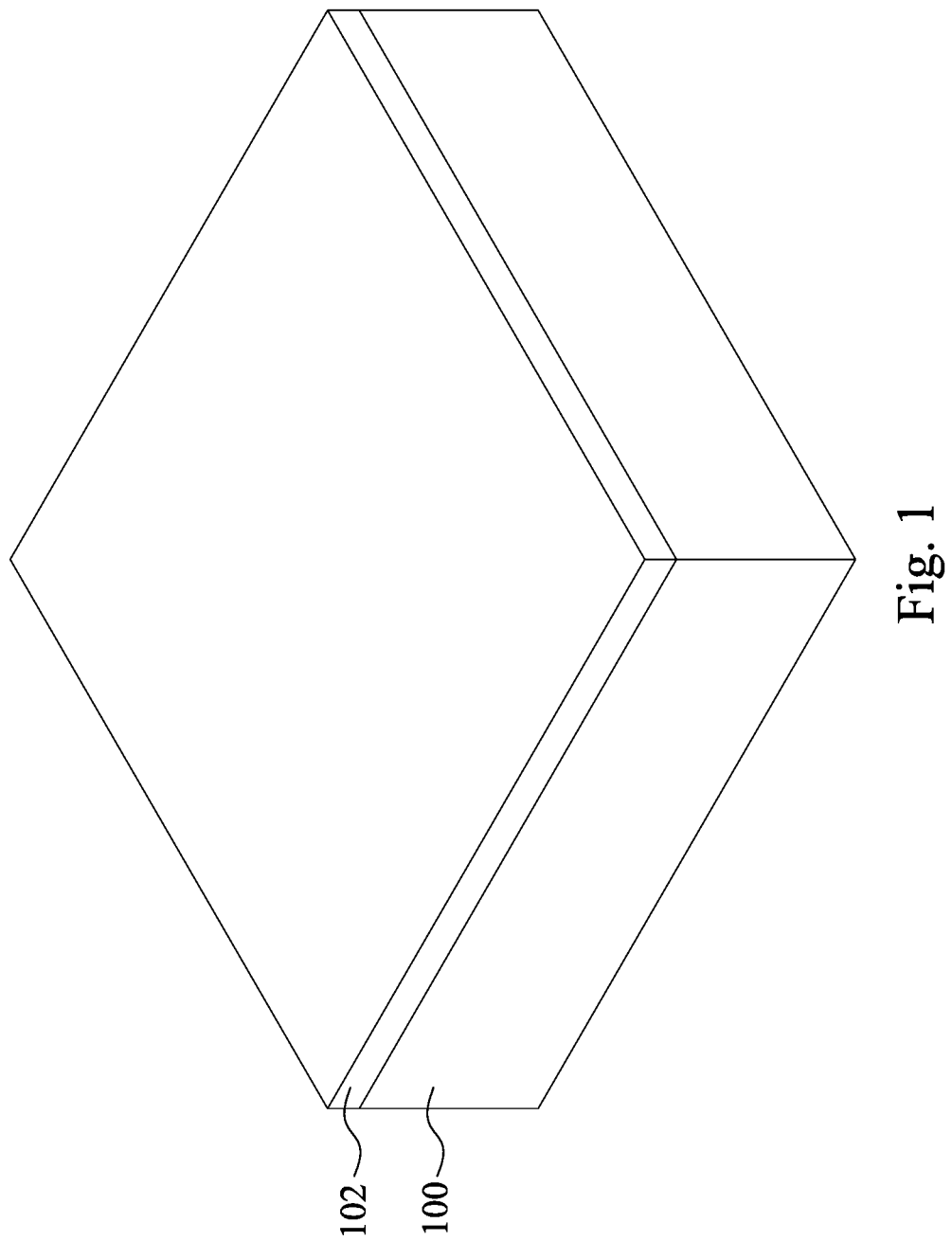
FIGS. 1-20 are perspective views of a semiconductor structure having fins at various stages of fabrication according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1-20 are perspective views of a semiconductor structure having fins at various stages of fabrication according to various embodiments of the present disclosure. A semiconductor structure having fins, such as a FinFET device, may be fabricated using CMOS technology processing. Accordingly, it is understood that additional processes may be provided before, during, and after the fabrication, and further, that some processes may be described only briefly herein. Also, FIGS. 1-20 are simplified for a better understanding of the concepts of some embodiments of the present disclosure.

Referring to FIG. 1, the fabrication begins with forming a first oxide layer 102 on a first semiconductor substrate 100. In some embodiments, the first semiconductor substrate 100 includes a crystal silicon material, and the first oxide layer 102 includes silicon oxide or other suitable materials. It is understood that the first semiconductor substrate 100 may include other suitable materials in alternative embodiments. The first semiconductor substrate 100 has a top surface substantially parallel to a (100) crystal plane. The first semiconductor substrate 100 having the top surface substantially parallel to the (100) crystal plane is chosen because the surface state density between the first semiconductor substrate 100 and the first oxide layer 102 is at a minimum when the top surface of the first semiconductor substrate 100 is substantially parallel to the (100) crystal plane.

The crystal planes are defined by the "Miller Indices" methodology, which provides a method to specify planes and directions in a silicon crystal. Orientations classified by the "Miller indices" include (100), (011), (110), and (111). The orientation of the wafer is classified by which orientation plane the surface of the wafer is substantially parallel to. The surface might not be exactly parallel, but slightly different, and the difference is referred to as the displacement angle or the off angle orientation. The crystal orientation can be denoted by either a notch or a flat cut into the wafer.

Figure 2:
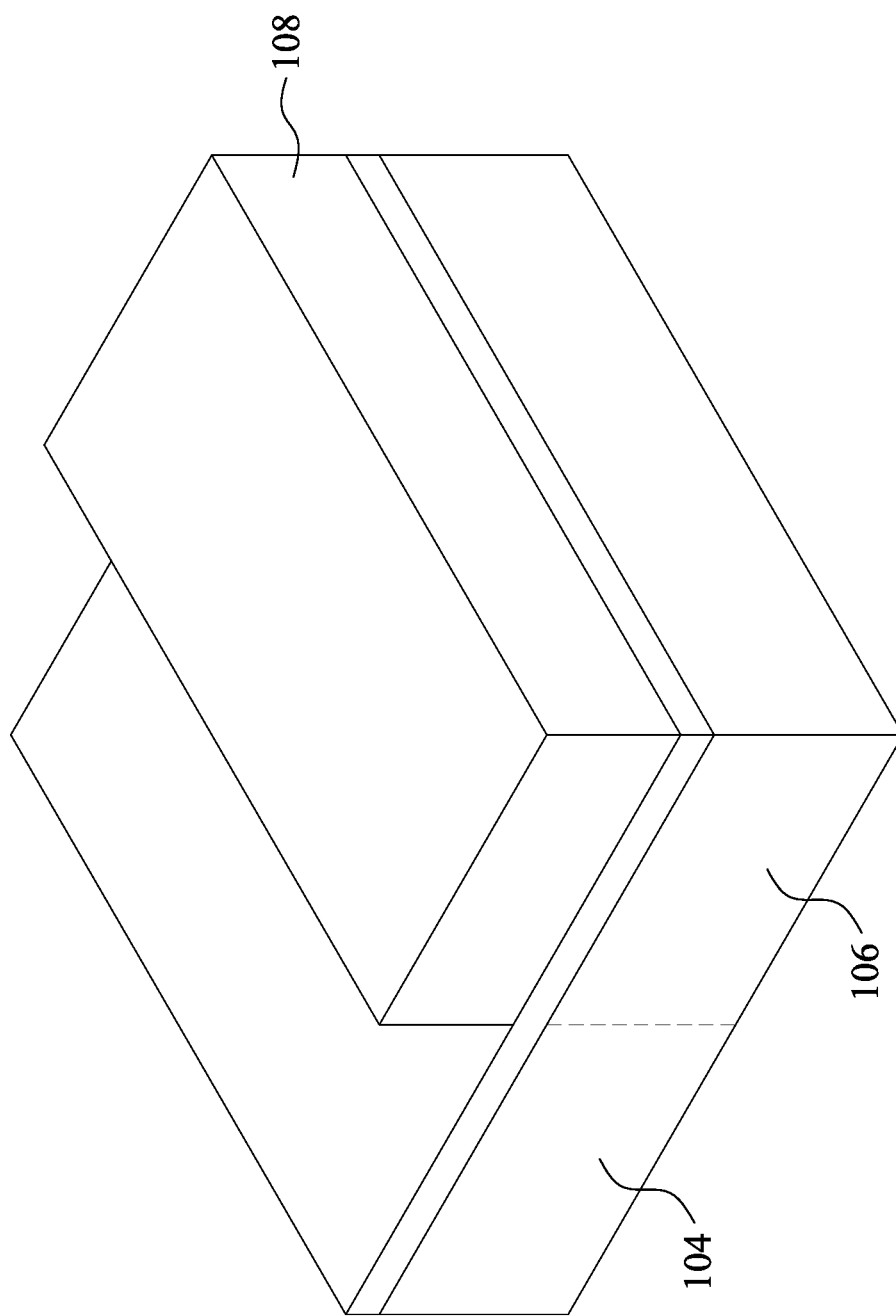

Reference is made to FIG. 2. The first semiconductor substrate 100 may include various doped regions depending on design requirements (e.g., p-type wells or n-type wells). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The fabrication includes performing one or more doping processes, such as implantation processes, to form an opposite type well in the first semiconductor substrate 100. In some embodiments, the first semiconductor substrate 100 is an N-type substrate, and a P-type doping process is performed to form a P-type well 104 in the first semiconductor substrate 100. A portion of an N-type well 106 is protected by a mask 108 during the doping process. After the P-type well 104 and the N-type well 106 are formed in the first semiconductor substrate 100, the mask 108 is removed.

Figure 3:
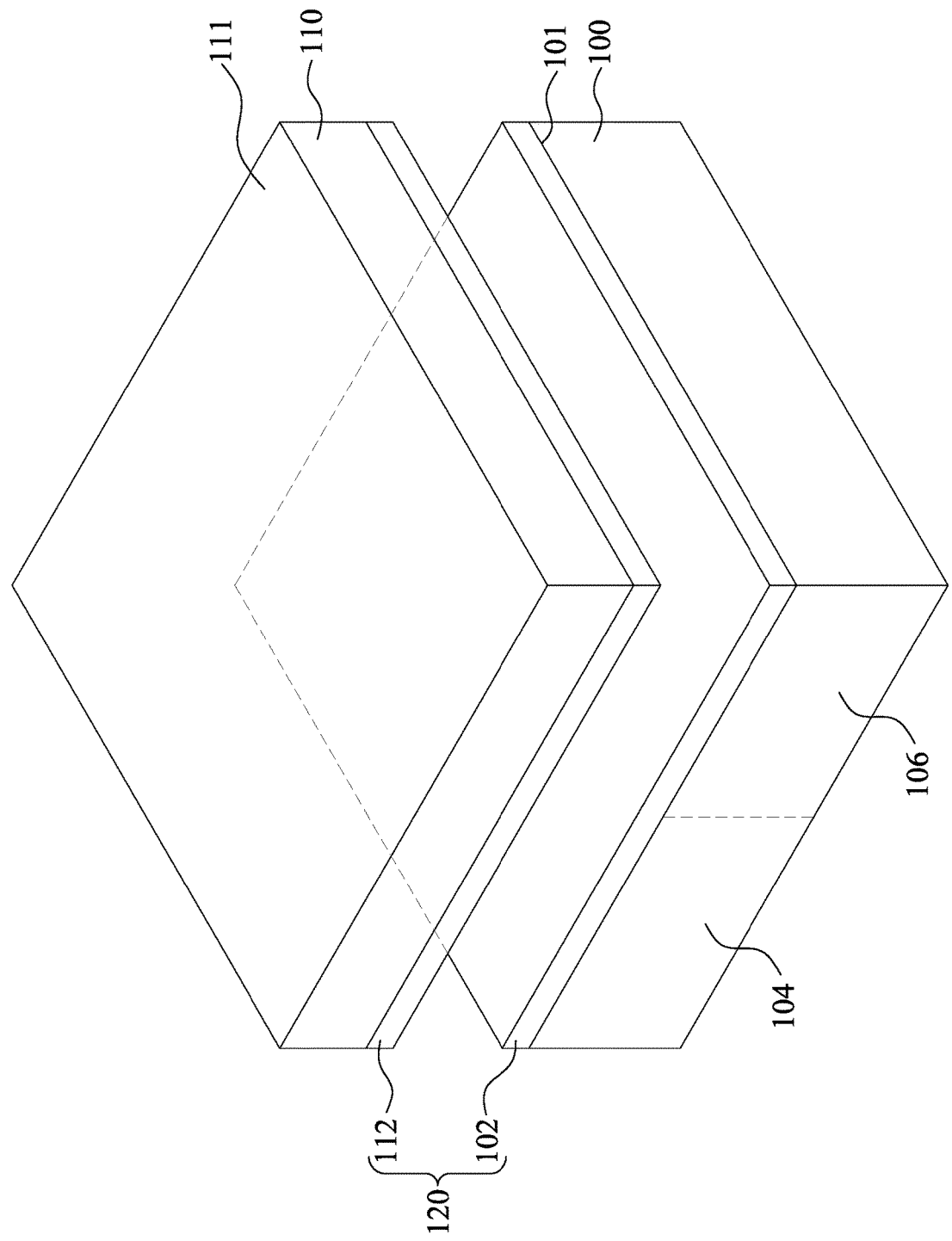

Reference is made to FIG. 3. A second semiconductor substrate 110 is bonded onto the first semiconductor substrate 100. The second semiconductor substrate 110 includes a crystal silicon material. It is understood that the second semiconductor substrate 110 may include other suitable materials in alternative embodiments. The second semiconductor substrate 110 has a top surface 111 substantially parallel to a crystal plane different from the (100) crystal plane. That is, the first semiconductor substrate 100 and the second semiconductor substrate 110 are substantially parallel to different crystal planes. For example, the top surface 101 of the first semiconductor substrate 100 is substantially parallel to a first crystal plane, such as the crystal plane (100), and the top surface 111 of the second semiconductor substrate 110 is substantially parallel to a second crystal plane, in which the second crystal plane is different from the first crystal plane. In some embodiments, the second crystal plane is a (110) crystal plane, and the second semiconductor substrate 110 is a (100) wafer rotated in a range from about 40 degrees to about 50 degrees.

In some embodiments, a second oxide layer 112 is formed on a bottom surface of the second semiconductor substrate 110, and the first semiconductor substrate 100 and the second semiconductor substrate 110 are bonded at the surfaces on which the first and second oxide layers 102, 112 are formed. In some embodiments, the second oxide layer 112 includes silicon oxide or other suitable materials. The first and second oxide layers 102, 112 are combined and become an insulator layer 120 bonding the first semiconductor substrate 100 and the second semiconductor substrate 110. The insulator layer 120 is disposed between and bridges the first semiconductor substrate 100 and the second semiconductor substrate 110, such that the interface between the first semiconductor substrate 100 and the second semiconductor substrate 110 is uniform and does not have a specific crystal plane. Thus, defects occurring at the interface between different orientations can be prevented. In some embodiments, the thickness of the insulator layer 120 is in a range from about 5 nm to about 10 nm. If the thickness of the insulator layer 120 is smaller than about 5 nm, it is difficult for the first semiconductor substrate 100 to be bonded with the second semiconductor substrate 110. If the thickness of the insulator layer 120 is greater than about 10 nm, on the other hand, the active regions of the fins are reduced.

Figure 4:
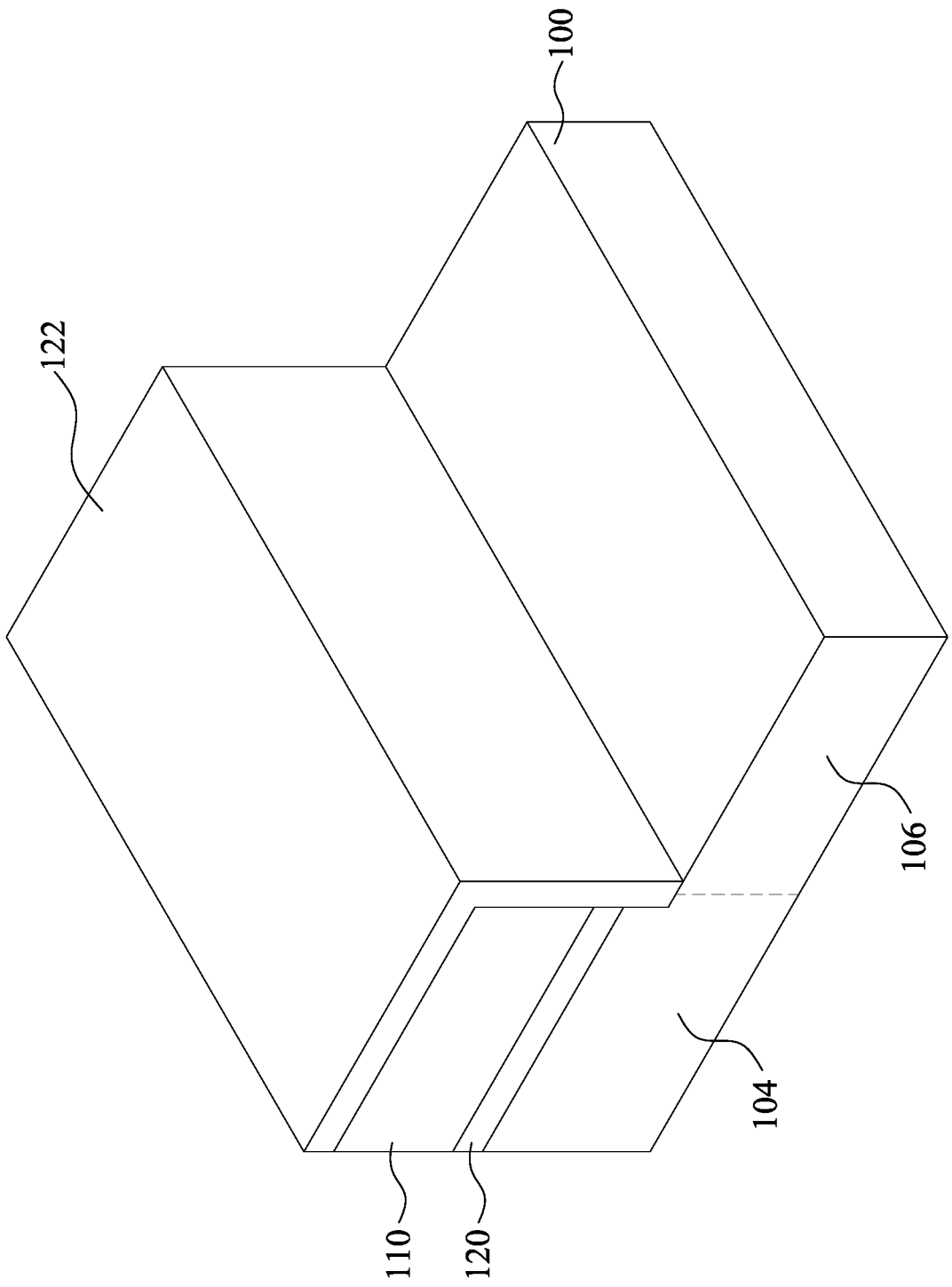

Reference is made to FIG. 4. Portions of the second semiconductor substrate 110 and the insulator layer 120 above the N-type well 106 are removed, and the N-type well 106 is exposed from the second semiconductor substrate 110. The removing process includes forming a mask protecting portions of the second semiconductor substrate 110 and the insulator layer 120 above the P-type well 104, performing a suitable etching process to remove the uncovered portions of the second semiconductor substrate 110 and the insulator layer 120, and removing the mask. In some embodiments, the chemical utilized for removing the second semiconductor substrate 110 and the insulator layer 120 includes hexafluoro-2-butyne ($C_4F_6$) and oxygen gas ($O_2$) based chemical to reduce the amount of Si recess. After the removing process, an oxide layer 122 is formed on a top surface and a side surface of the remaining second semiconductor substrate 110, as well as on a side surface of the remaining insulator layer 120. The oxide layer 122 is formed by, for example, an atomic layer deposition (ALD) process. In some embodiments, the thickness of the oxide layer 122 is in a range from about 4 nm to about 6 nm, and the oxide layer 122 includes silicon oxide or other suitable materials. In some embodiments, a top surface of the N-type well 106 might be lower than an interface between the P-type well 104 and the insulator layer 120 after the etching process because the etching process might etch the N-type well 106.

Figure 5:
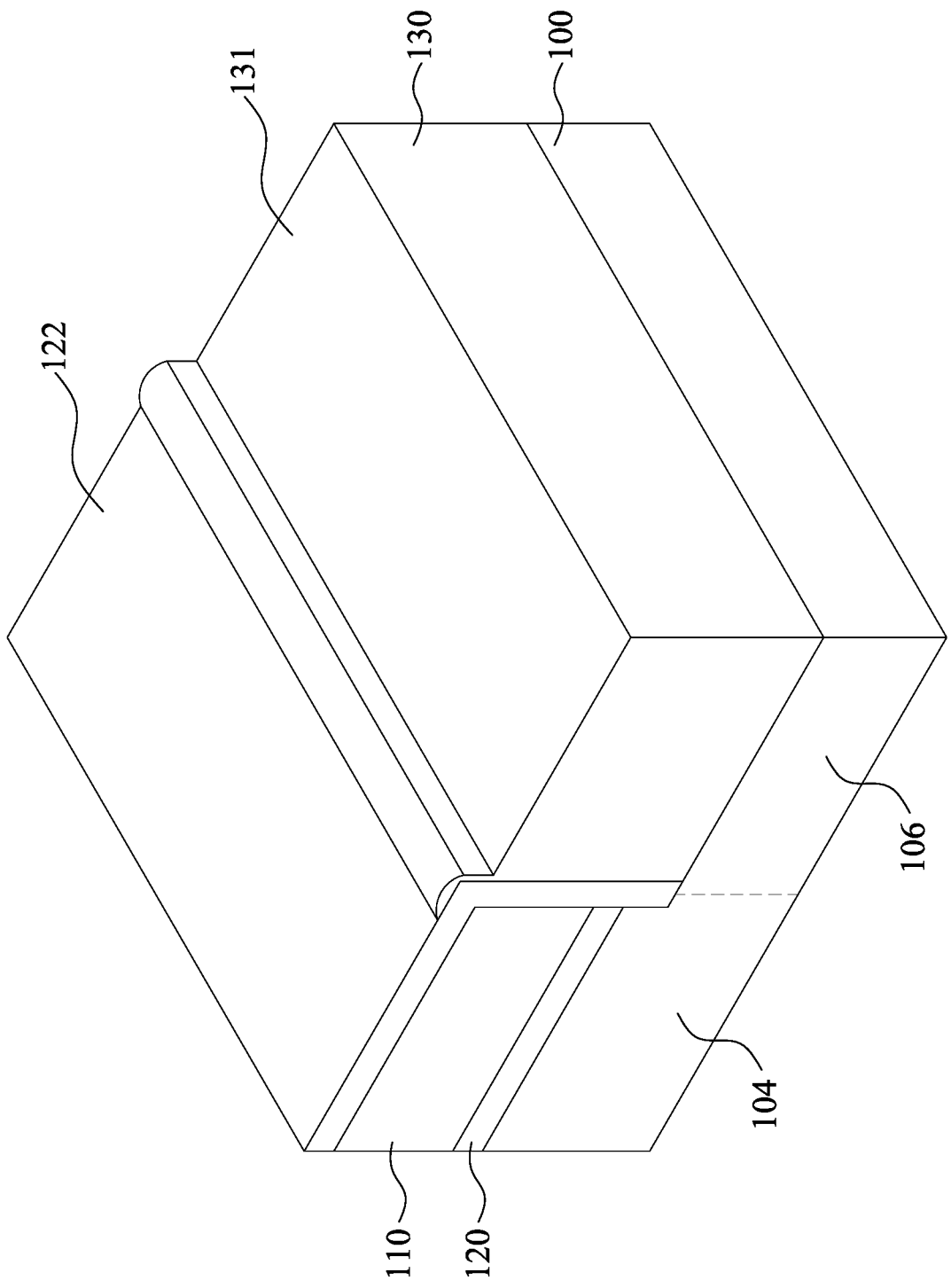

Reference is made to FIG. 5. An epitaxy layer 130 is epitaxially grown on the exposed portion of the first semiconductor substrate 100. The material of the epitaxy layer 130 is chosen to form P-type devices. In some embodiments, the epitaxy layer 130 includes silicon-germanium (SiGe) or other suitable materials. In some embodiments, the epitaxy layer 130 has a top surface 131 substantially parallel to the first crystal plane, such as the crystal plane (100).

Figure 6:
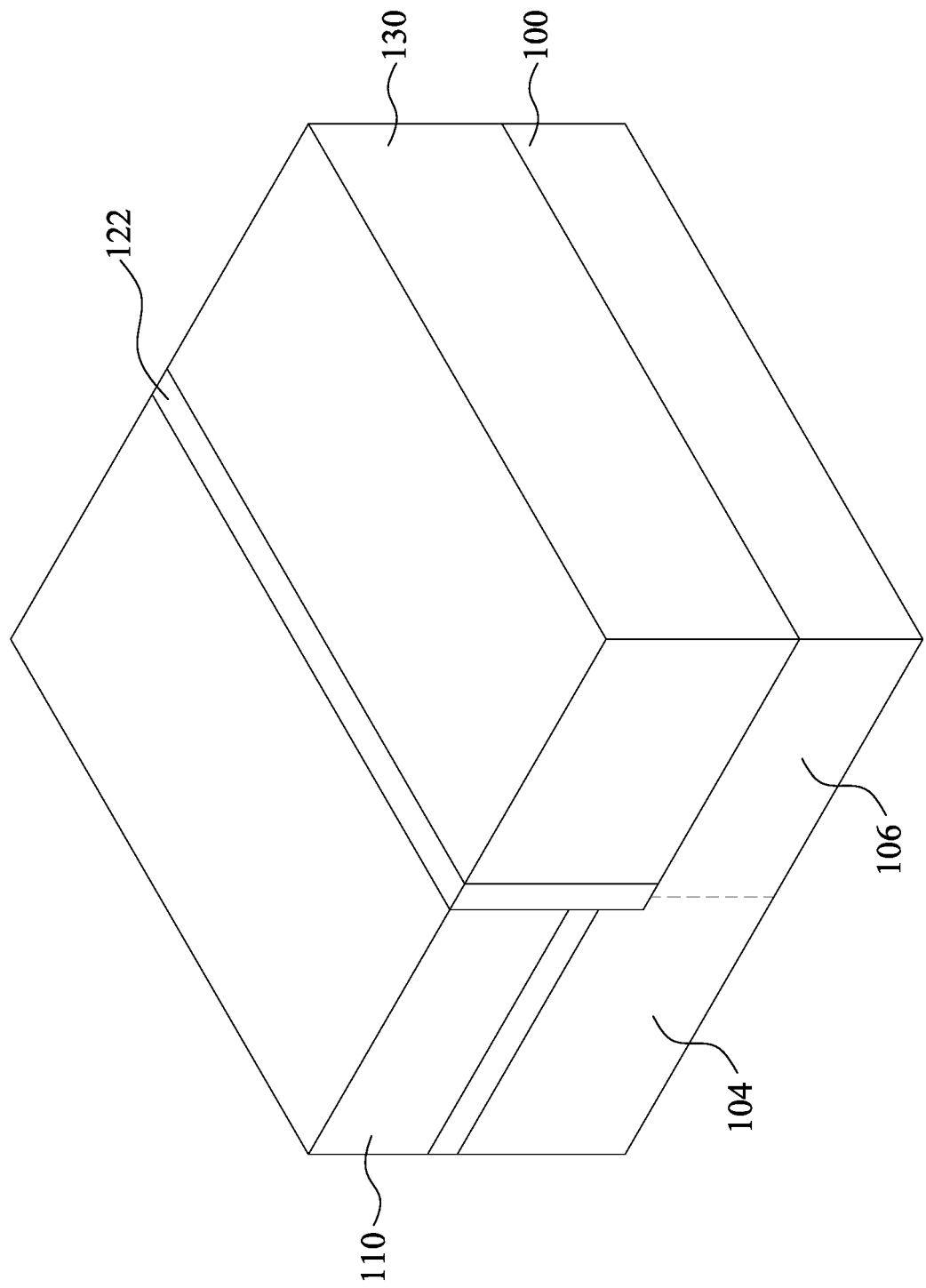

Reference is made to FIG. 6. A surface planarizing process is performed to planarize the top surfaces of the second semiconductor substrate 110 and the epitaxy layer 130. The top surface of the second semiconductor substrate 110 and the top surface of the epitaxy layer 130 are substantially coplanar following the planarizing process. The oxide layer 122, which functions as a boundary between the second semiconductor substrate 110 and the epitaxy layer 130, is not covered by the epitaxy layer 130 subsequent to the planarizing process. In some embodiments, the planarizing process includes performing a polishing process, such as a chemical mechanical polishing (CMP) process.

Figure 7:
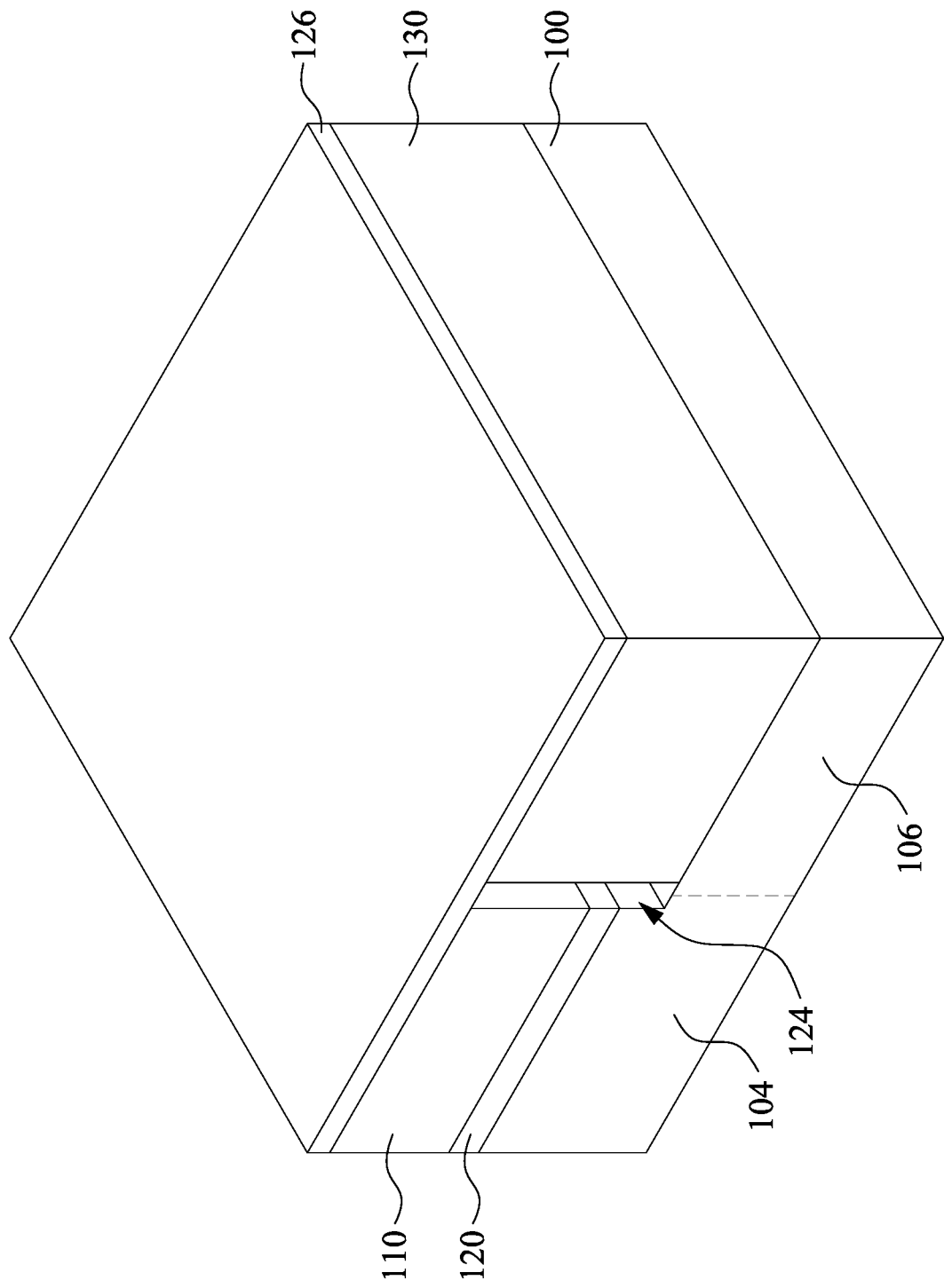

Reference is made to FIG. 7. The oxide layer 122 between the second semiconductor substrate 110 and the epitaxy layer 130 is removed. Thus, a slot 124 is formed between the second semiconductor substrate 110 and the epitaxy layer 130. In some embodiments, the oxide layer 122 is a silicon oxide layer, and the oxide layer 122 is removed by a wet etching process using a diluted hydrofluoric acid (HF) solution. After the removing process, the side surfaces of the second semiconductor substrate 110, the insulator layer 120, and the epitaxy layer 130 are exposed.

In some embodiments, a capping layer 126 is formed on the second semiconductor substrate 110 and the epitaxy layer 130. The capping layer 126 is formed also on the slot 124 between the second semiconductor substrate 110 and the epitaxy layer 130. In some embodiments, the capping layer 126 is a silicon layer deposited by an ALD process, and the thickness of the capping layer 126 is in a range from about 4 nm to about 6 nm. In some embodiments, the capping layer 126 overhangs the slot 124 and covers the slot 124.

In some embodiments, the width of the slot 124 between the second semiconductor substrate 110 and the epitaxy layer 130 is in a range from about 4 nm to about 6 nm, and the aspect ratio of the slot 124 is in a range from about 15 to about 20. If the width of the slot 124 is greater than about 6 nm, some film materials, e.g. the capping layer 126, might fill in the slot 124. The film materials filling in the slot 124 might become a source of defect in the following etching process. For example, the film materials in the slot 124 might be peeled from the slot 124 during the etching process. Peeling of the film materials makes the profile control more difficult and also causes unwanted contaminants. If the width of the slot 124 is smaller than about 4 nm, the thickness of the oxide layer 122 in the previous stage might be too thin and is unable to cover the whole side surface of the second semiconductor substrate 110, and some portions of the side surface of the second semiconductor substrate 110 might be exposed from the oxide layer 122. The epitaxy layer 130 might be grown from the exposed side surface of the second semiconductor substrate 110. The epitaxy layer 130 grown from the exposed side surface of the second semiconductor substrate 110 and the top surface of the first semiconductor substrate 100 might undesirably have multiple crystalline phases. The multiple crystalline phases of the epitaxy layer 130 might cause mushroom-shaped defects.

Figure 8:
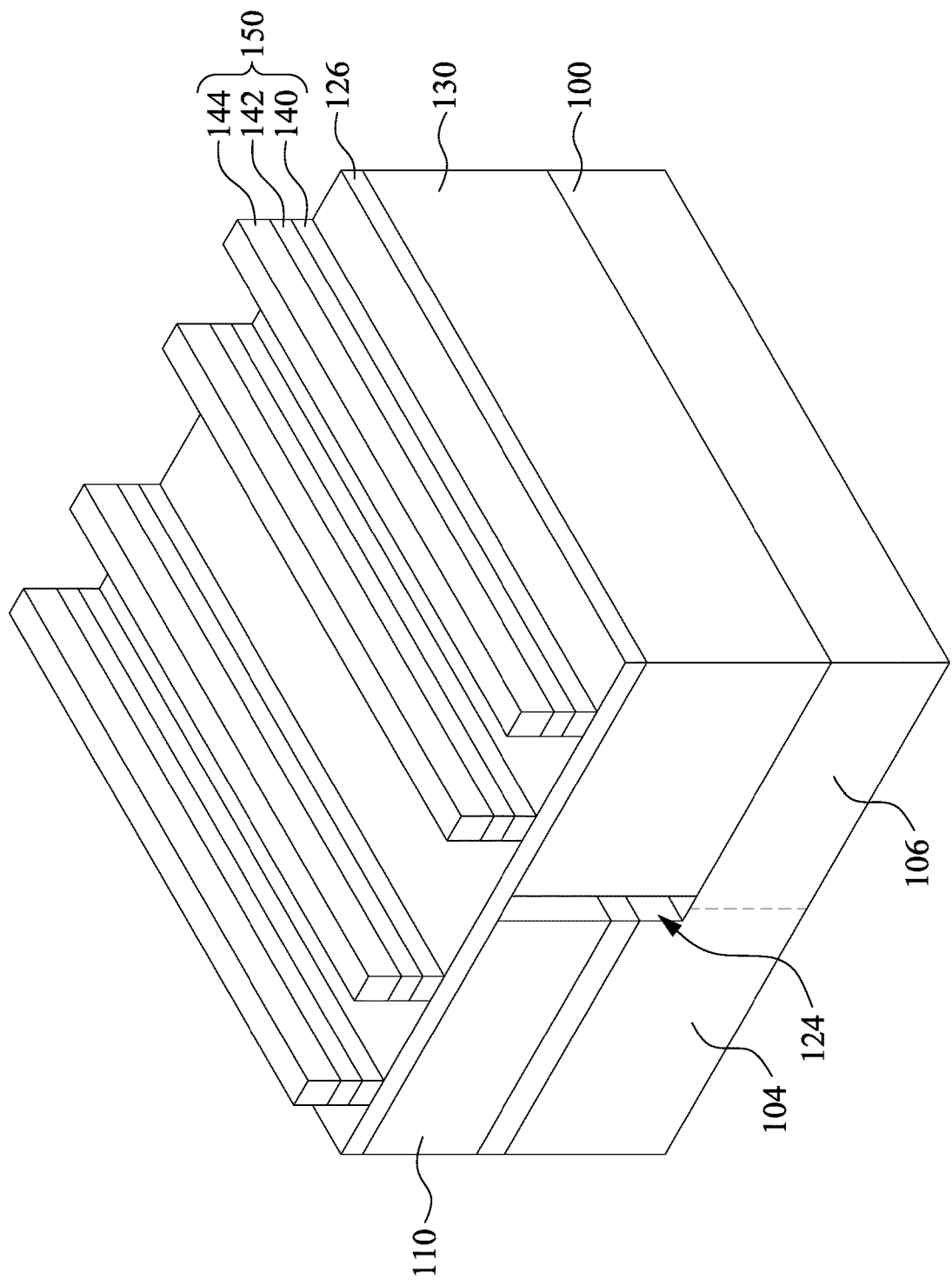
Figure 9:
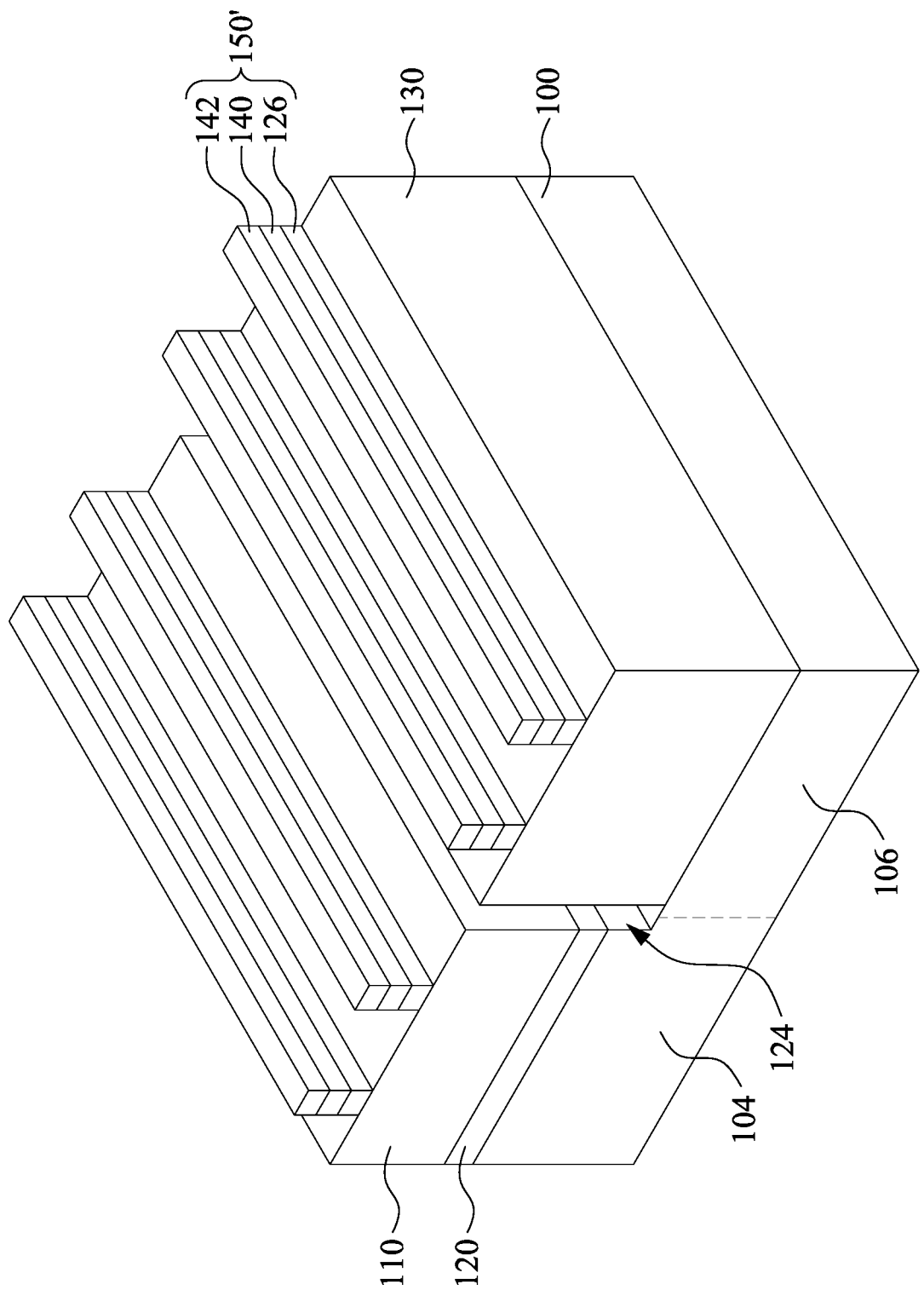

Reference is made to FIGS. 8 and 9. A plurality of masking features 150 are formed on the second semiconductor substrate 110 and the epitaxy layer 130. Formation of the masking features 150 includes forming a silicon nitride layer 140, a silicon oxide layer 142, and a photoresist layer 144 on the capping layer 126, and then patterning the photoresist layer 144, the silicon oxide layer 142, the silicon nitride layer 140, and the capping layer 126 by a suitable lithography and etching process. The remaining photoresist layer 144 is subsequently removed, and the remaining silicon oxide layer 142, silicon nitride layer 140, and capping layer 126 can be regarded as hard mask features 150' in the following etching process, as shown in FIG. 9. In some embodiments, the thickness of the hard mask features 150' is in a range from about 30 nm to about 40 nm.

Figure 10:
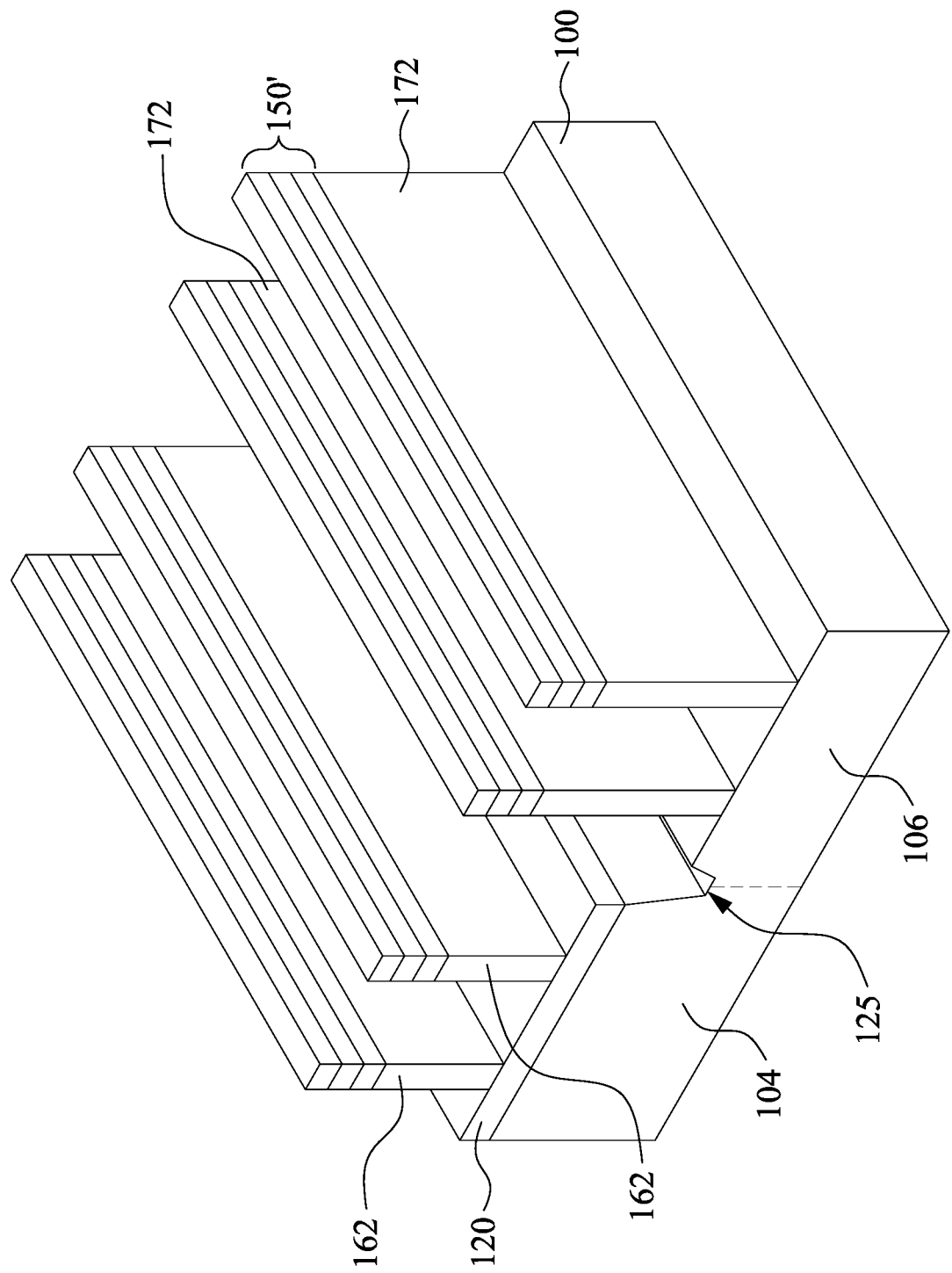

Reference is made to FIG. 10. A plurality of protrusions are formed on the first semiconductor substrate 100. In some embodiments, portions of the second semiconductor substrate 110 and the epitaxy layer 130 (see FIG. 9) uncovered by the hard mask features 150' are removed by an etching process, such that semiconductor portions 162 and semiconductor portions 172 are formed on the P-type well 104 and the N-type well 106 respectively. In some embodiments, the semiconductor portions 162 serve as upper fins of the first fins on the P-type well 104, and the semiconductor portions 172 serve as upper fins of the second fins on the N-type well 106. Therefore, the semiconductor portions 162, 172 are hereinafter referred to as the upper portions of the fins 162, 172. The upper portions of the fins 162, 172 are formed by an etching process stopping at the insulator layer 120. This etching process can be regarded as a first etching process of forming the first fins on the P-type well 104 and the second fins on the N-type well 106. In some embodiments, the height of the upper portions of the fins 162 is in a range from about 50 nm to about 60 nm.

In the first etching process, a portion of the first semiconductor substrate 100 directly under the slot 124 (see FIG. 9) is also etched, and hence a notch 125 is formed to extend into the first semiconductor substrate 100. Since the etching of the first semiconductor substrate 100 through the deep and narrow slot 124 (see FIG. 9) is slow, the notch 125 has a depth that is smaller than the thickness of the epitaxy layer 130 (see FIG. 9). In accordance with some embodiments, the depth of the notch 125 is in a range from about 5 nm and about 40 nm.

In some embodiments, the insulator layer 120 remains on the P-type well 104 after the first etching process. That is, the chemical utilized in the first etching process has a high etching selectivity between the second semiconductor substrate 110 (see FIG. 9) and the insulator layer 120 and a high etching selectivity between the epitaxy layer 130 (see FIG. 9) and the insulator layer 120. In some embodiments, the first etching process utilized to pattern the second semiconductor substrate 110 and the epitaxy layer 130 is a plasma etching process, and the chemical utilized in the first etching process is a chlorine-based plasma, which has a faster etching rate on the second semiconductor substrate 110 and the epitaxy layer 130 than it does on the insulator layer 120. In some embodiments, the process gas of the first etching process includes chlorine gas ($Cl_2$) and hydrogen bromide (HBr). The flow rate of $Cl_2$ is in a range from about 100 sccm to about 300 sccm, and the flow rate of HBr is in a range from about 50 sccm to about 150 sccm. In some embodiments, a ratio of the flow rate of $Cl_2$ to the flow rate of HBr is in a range from about 2:1 to about 5:1. If the ratio of the flow rate of $Cl_2$ to the flow rate of HBr is outside this range, profiles of the upper portions of the fins 162, 172 might be unsatisfactory.

In some embodiments, the temperature of the first etching process is in a range from about 100 degrees Celsius to about 200 degrees Celsius. If the temperature of the first etching process is greater than about 200 degrees Celsius, the etching rate of the first etching process might be too high, and thus an etching selectivity between the second semiconductor substrate 110 and the insulator layer 120 and an etching selectivity between the epitaxy layer 130 and the insulator layer 120 might be unsatisfactory. If the temperature of the first etching process is lower than about 100 degrees Celsius, the etching rate of the first etching process might be too low, and thus side surfaces of the fins 162, 172 might not be straight enough.

In some embodiments, the radio frequency (RF) power of the first etching process is in a range from about 300 watts to about 500 watts. If the RF power of the first etching process is greater than about 500 watts, the etching rate of the first etching process might be too high, and thus the etching selectivity between the second semiconductor substrate 110 and the insulator layer 120 and the etching selectivity between the epitaxy layer 130 and the insulator layer 120 might be unsatisfactory. If the RF power of the first etching process is lower than about 300 watts, the etching rate of the first etching process might be too low, and thus the side surfaces of the fins 162, 172 might not be straight enough.

The first etching process can be controlled by a suitable etching time. In some embodiments, the etching time of the first etching process is in a range from about 2 minutes to about 5 minutes. If the etching time of the first etching process is less than about 2 minutes, the insulator layer 120 and/or the first semiconductor substrate 100 might not be exposed by the first etching process. If the etching time of the first etching process is greater than about 5 minutes, the insulator layer 120 and/or the first semiconductor substrate 100 might be over-etched by the first etching process.

Figure 11:
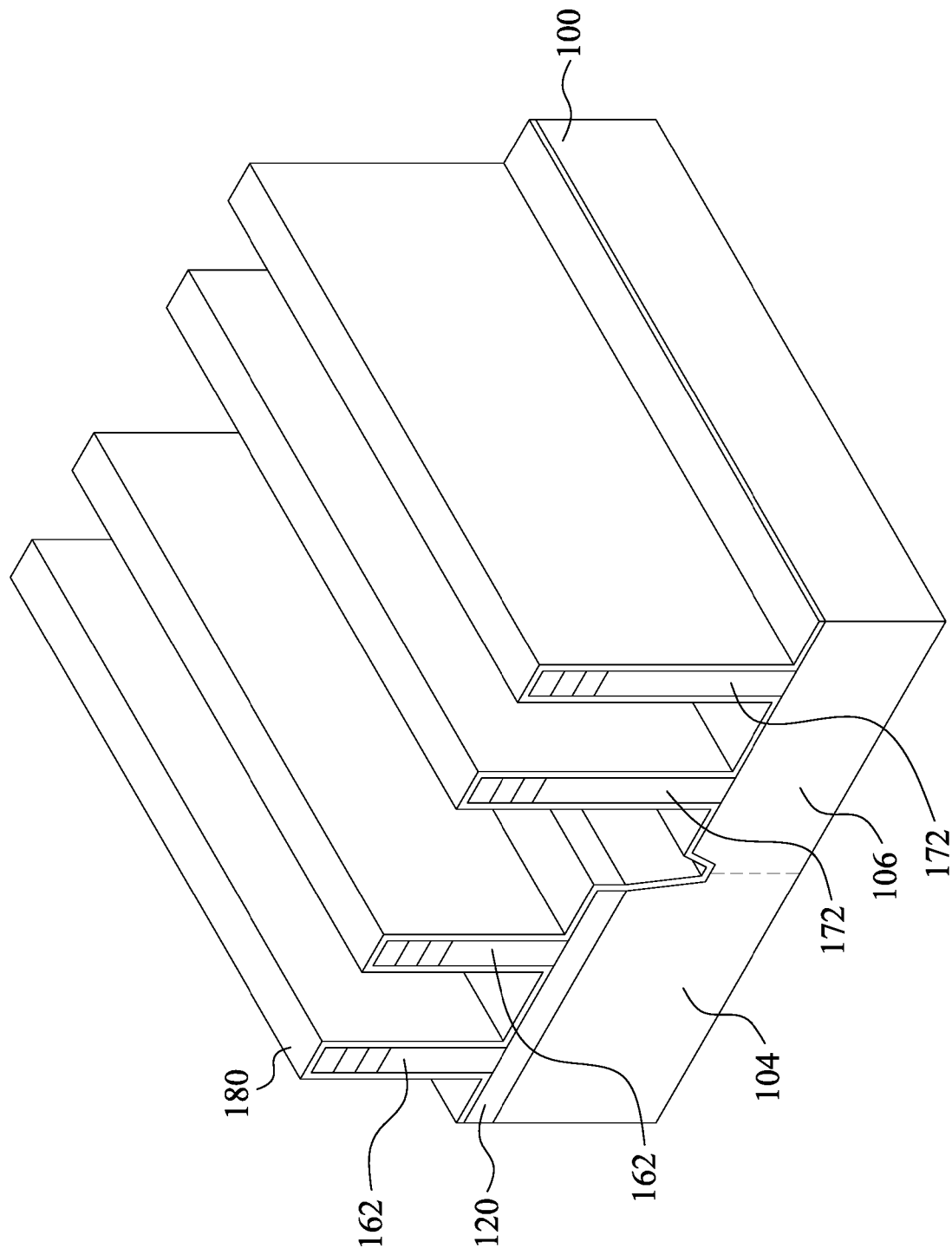

Reference is made to FIG. 11. A protection layer 180 is formed on the structure illustrated in FIG. 10. The protection layer 180 is a thin film formed by a suitable deposition process, such as an ALD process. In some embodiments, the protection layer 180 is an oxide layer, such as a silicon oxide layer, and the thickness of the protection layer 180 is in a range from about 2 nm to about 3 nm. The protection layer 180 is conformally deposited on the structure. In some embodiments, the protection layer 180 is formed covering the top and side surfaces of the upper portions of the fins 162, 172. The top surfaces of the insulator layer 120 and the first semiconductor substrate 100 between the upper portions of the fins 162, 172 are also covered by the protection layer 180. The protection layer 180 can protect the profiles of the upper portions of the fins 162, 172 in the following etching process.

Figure 12:
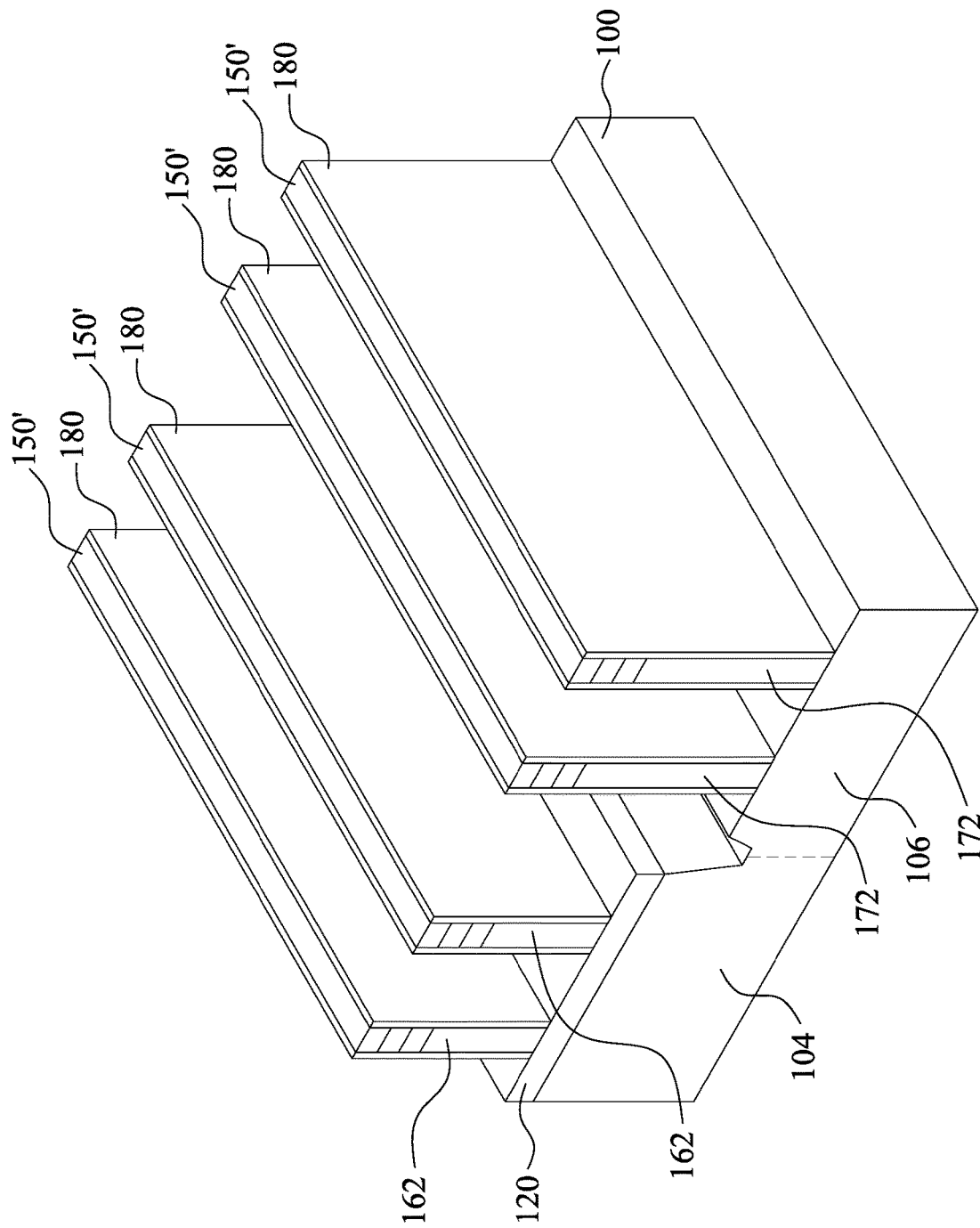

Reference is made to FIG. 12. A plasma bombardment is performed to remove portions of the protection layer 180. Due to the direction of the plasma bombardment, e.g. vertical plasma bombardment, the portions of the protection layer 180 at the top surfaces of the upper portions of the fins 162, 172, the insulator layer 120, and the first semiconductor substrate 100 are removed after the plasma bombardment. Therefore, portions of the insulator layer 120 are exposed from the gaps between the upper portions of the fins 162, 172. Portions of the protection layer 180 at the side surfaces of the upper portions of the fins 162, 172 still remain after the plasma bombardment to maintain the profiles of the upper portions of the fins 162, 172. Namely, the upper portions of the fins 162, 172 are protected by the hard mask features 150' and the protection layer 180 during the plasma bombardment.

Figure 13:
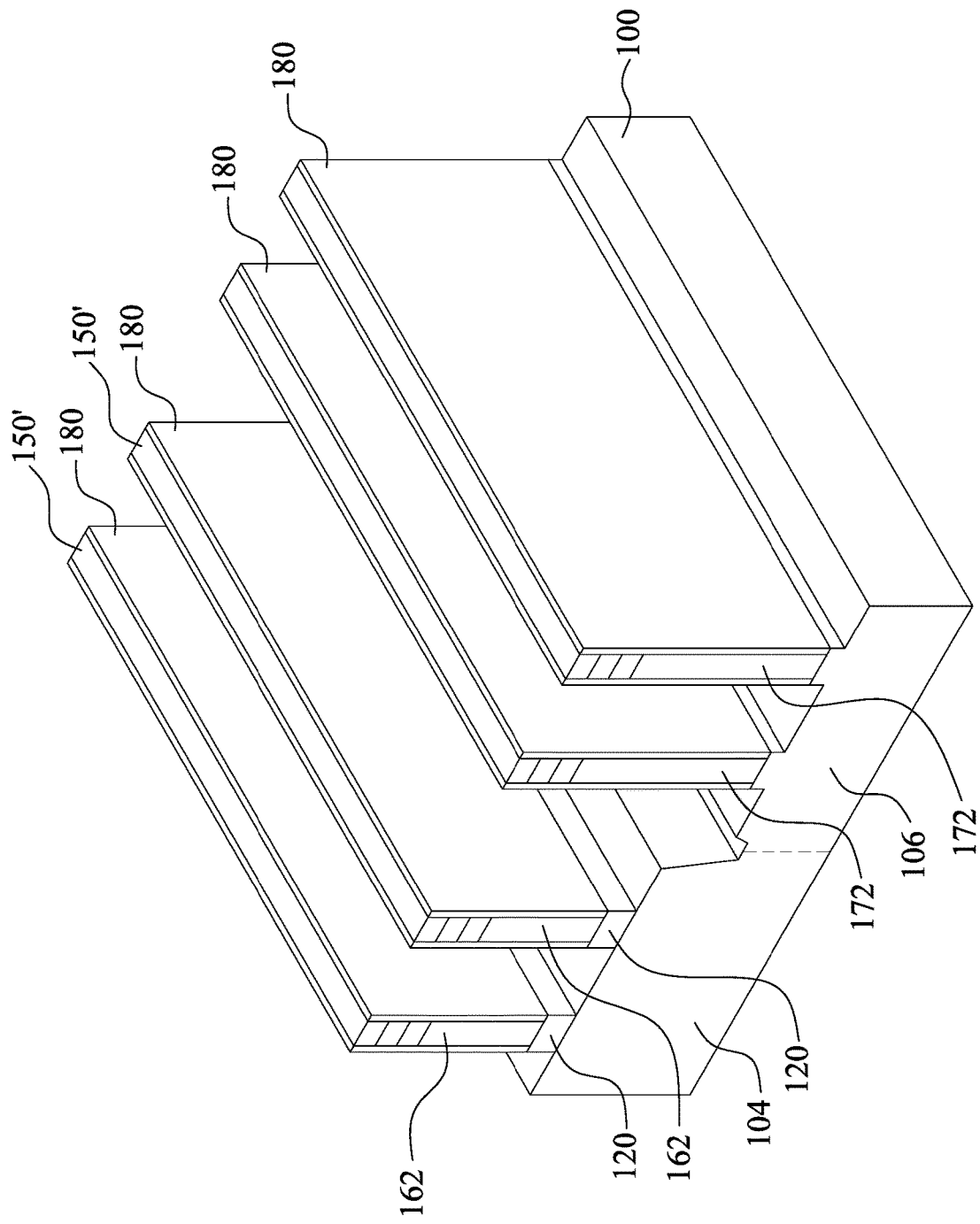

Reference is made to FIG. 13. The plasma bombardment continues to break through the insulator layer 120. The plasma bombardment removes the portion of the insulator layer 120 uncovered by the hard mask features 150' to further expose the underlying first semiconductor substrate 100. In some embodiments, the hard mask features 150' may be partially consumed during the process of breaking through the insulator layer 120, but most of the hard mask features 150' remain on the upper portions of the fins 162, 172. The hard mask features 150' and the remaining protection layer 180 at the side surfaces of the upper portions of the fins 162, 172 can protect the upper portions of the fins 162, 172 while the plasma bombardment breaks through the insulator layer 120.

The gas utilized in the plasma bombardment as illustrated in FIGS. 12 and 13 is chosen to have a high selectivity between the insulator layer 120 and the first semiconductor substrate 100 such that the first semiconductor substrate 100 is not overly removed. The gas utilized in the plasma bombardment is different from that utilized in the first etching process. As described above, the chemical utilized in the first etching process of patterning the upper portions of the fins 162, 172 is a chlorine-based chemical, such as $Cl_2$/HBr, and the chemical utilized in the plasma bombardment to break through the insulator layer 120 is a fluorine-based chemical, which has a faster etching rate on the insulator layer 120 than it does on the first semiconductor substrate 100.

In some embodiments, the process gas of the plasma bombardment process includes tetrafluoromethane ($CF_4$), fluoroform ($CHF_3$), and $O_2$, in which the flow rate of $CF_4$ is in a range from about 50 sccm to about 200 sccm, the flow rate of the $CHF_3$ is in a range from about 50 sccm to about 200 sccm, and the flow rate of $O_2$ is in a range from about 20 sccm to about 200 sccm. The ratio of the flow rates of $CF_4$, $CHF_3$, and $O_2$ can be modified to adjust the etching rate and the etching selectivity. In some embodiments, $CF_4$:$CHF_3$:$O_2$ is in range from about 1:1:3 to about 1:1:10. Too much $CF_4$ and/or $CHF_3$ might make the etching rate of the plasma bombardment process too high, and thus an etching selectivity between the insulator layer 120 and the first semiconductor substrate 110 might be unsatisfactory. On the other hand, too much $O_2$ might make the etching rate of the plasma bombardment process too low, and thus the side surfaces of the fins 162, 172 might not be straight enough.

In some embodiments, the temperature of the plasma bombardment process is in a range from about 100 degrees Celsius to about 200 degrees Celsius. If the temperature of the plasma bombardment process is greater than about 200 degrees Celsius, the etching rate of the plasma bombardment process might be too high, and thus the etching selectivity between the insulator layer 120 and the first semiconductor substrate 110 might be unsatisfactory. If the temperature of the plasma bombardment process is lower than about 100 degrees Celsius, the etching rate of the plasma bombardment process might be too low, and thus the side surfaces of the fins 162, 172 might not be straight enough.

In some embodiments, the RF power of the plasma bombardment process is in a range from 200 watts to about 500 watts. If the RF power of the plasma bombardment process is greater than about 500 watts, the etching rate of the plasma bombardment process might be too high, and thus the etching selectivity between the insulator layer 120 and the first semiconductor substrate 110 might be unsatisfactory. If the RF power of the plasma bombardment process is lower than about 200 watts, the etching rate of the plasma bombardment process might be too low, and thus the side surfaces of the fins 162, 172 might not be straight enough.

The plasma bombardment process is stopped when reaching the P-type well 104 of the first semiconductor substrate 100. In some embodiments, the plasma bombardment process can be controlled by a suitable etching time. For example, the etching time of the plasma bombardment process is in a range from about 10 seconds to about 30 seconds. If the etching time of the plasma bombardment process is less than about 10 seconds, the P-type well 104 of the first semiconductor substrate 100 might not be exposed by the plasma bombardment process. If the etching time of the plasma bombardment process is greater than about 30 seconds, the first semiconductor substrate 100 might be over-etched by the plasma bombardment process. In some other embodiments, Si and O are detected during the plasma bombardment process. The plasma bombardment process is stopped when a ratio of Si to O significantly varies, which means the P-type well 104 of the first semiconductor substrate 100 is exposed by the plasma bombardment process.

Figure 19:
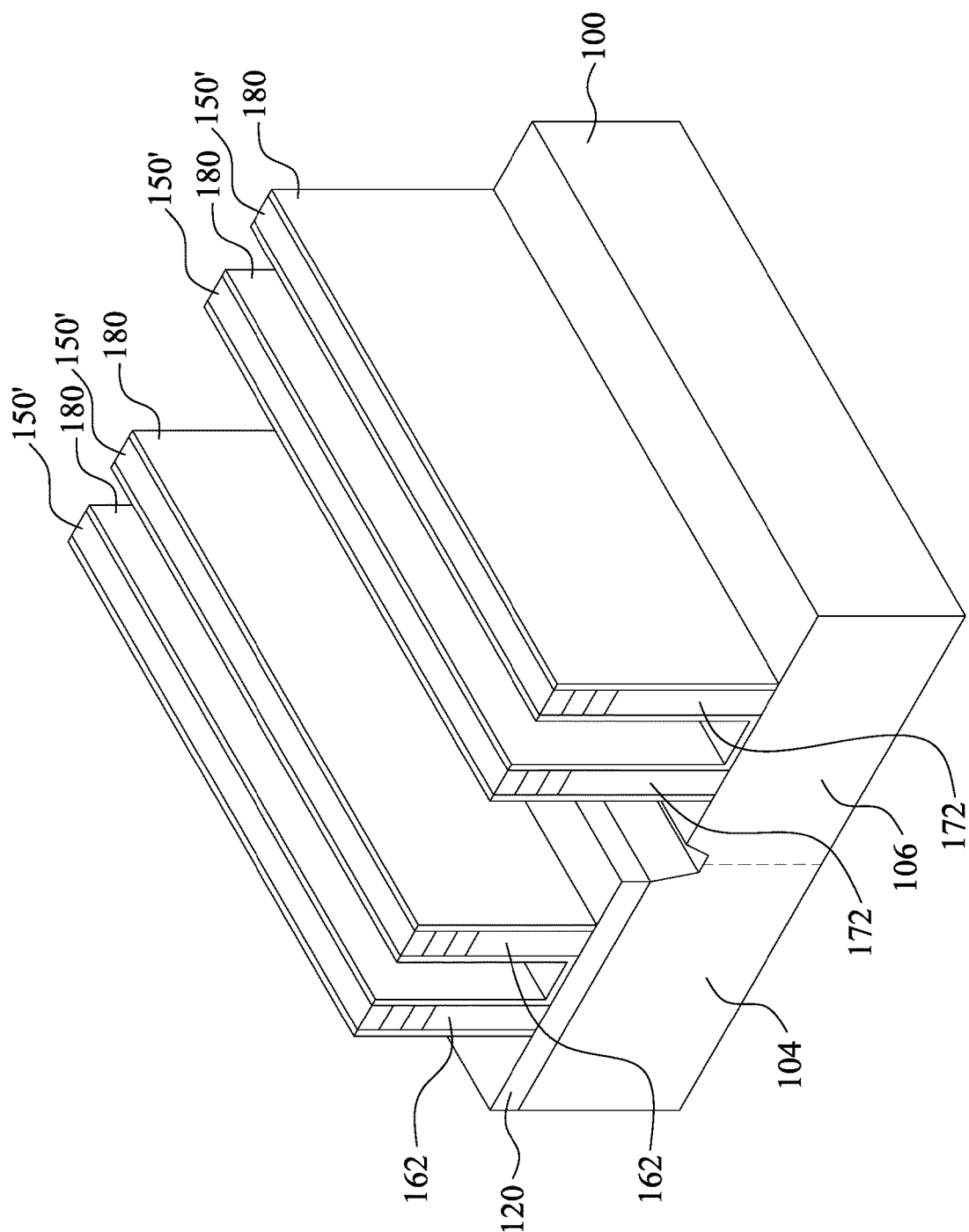

In some embodiments, as illustrated in FIG. 19, the protection layer 180 might remain on the insulator layer 120 at the position between the fins 162 when the pitch between the fins 162 is too small. The protection layer 180 might also remain on the first semiconductor substrate 100 at the position between the fins 172 when the pitch between the fins 172 is too small. In some embodiments, when the pitch between the fins 162 is smaller than, for example, about 8-10 nm, the protection layer 180 might not be completely removed and might remain on the insulator layer 120 at the position between the fins 162. Also, when the pitch between the fins 172 is smaller than, for example, about 8-10 nm, the protection layer 180 might not be completely removed and might remain on the first semiconductor substrate 100 at the position between the fins 172.

Figure 20:
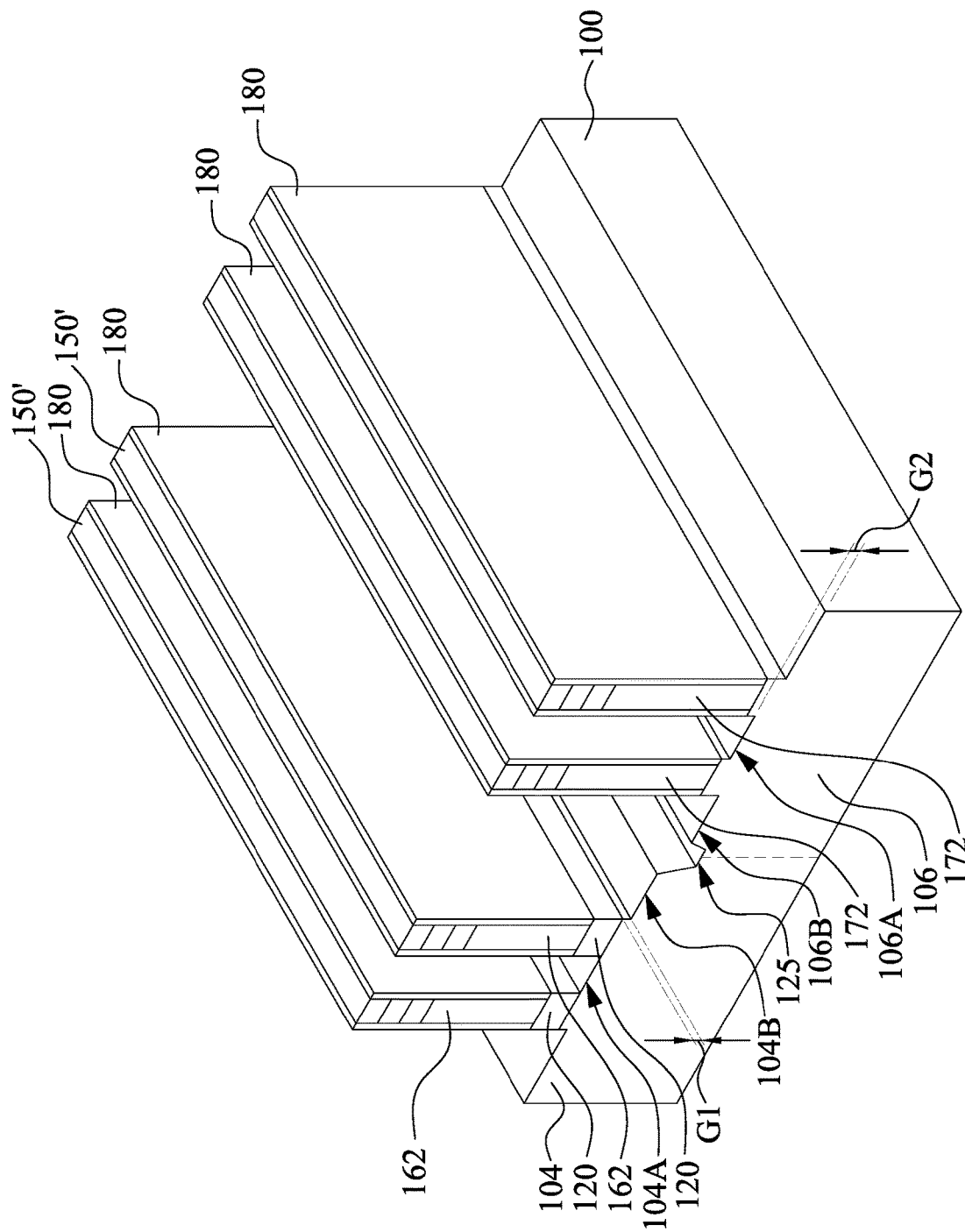

As illustrated in FIG. 20, due to the remaining protection layer 180, after the plasma bombardment process, a first portion 104A of the top surface of the P-type well 104 between the fins 162 is higher than a second portion 104B of the top surface of the P-type well 104 adjacent to the notch 125, and a first portion 106A of the top surface of the N-type well 106 between the fins 172 is higher than a second portion 106B of the top surface of the N-type well 106 adjacent to the notch 125. In some embodiments, a height difference G1 between the first portion 104A and the second portions 104B is in a range from about 5 nm to about 10 nm.

If the height difference G1 is greater than about 10 nm, the aspect ratio of the fins 162 might be too high, and thus the fins 162 might have tapering and/or tilting issues. If the height difference G1 is smaller than about 5 nm, that means the protection layer 180 is almost completely removed in the previous step.

Also, a height difference G2 between the first portion 106A and the second portions 106B is in a range from about 5 nm to about 10 nm. If the height difference G2 is greater than about 10 nm, the aspect ratio of the fins 172 might be too high, and thus the fins 172 might have tapering and/or tilting issues. If the height difference G2 is smaller than about 5 nm, that means the protection layer 180 is almost completely removed in the previous step.

Figure 14:
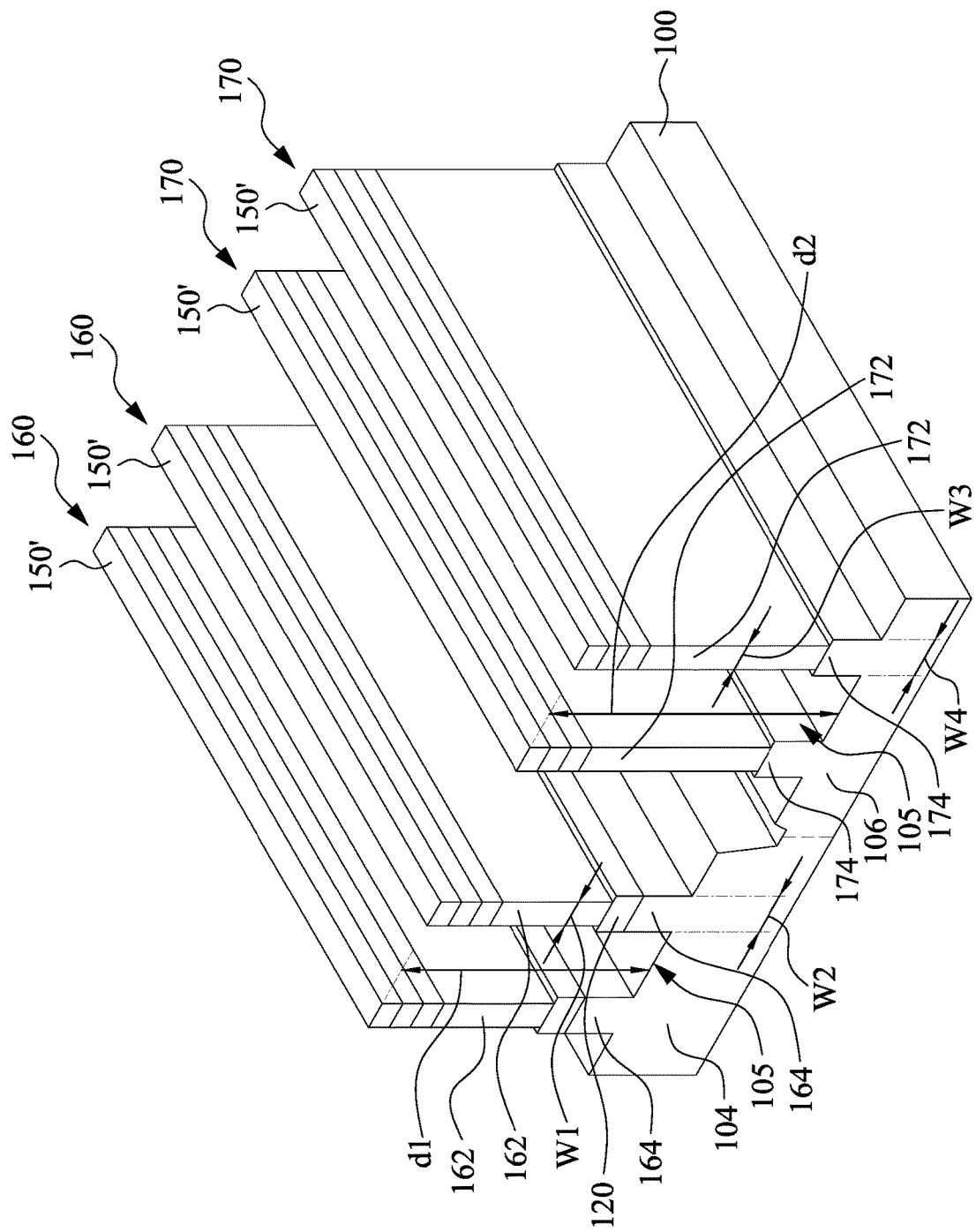

Reference is made to FIG. 14. After the plasma bombardment, the top surface of the first semiconductor substrate 100 is exposed by the gaps between the upper portions of the fins 162, 172. A second etching process is performed to recess the first semiconductor substrate 100. Portions of the first semiconductor substrate 100 uncovered by the hard mask features 150' are recessed by the second etching process to form trenches 105 between the upper portions of the fins 162, 172. In some embodiments, the depth of the trenches 105 is in a range from about 110 nm to about 130 nm.

After the second etching process, semiconductor portions 164 and semiconductor portions 174 are formed protruding from the first semiconductor substrate 100. The semiconductor portions 164 serve as bottom portions of the first fins on the P-type well 104, and the semiconductor portions 174 serve as bottom portions of the second fins on the N-type well 106. Therefore, the semiconductor portions 164, 174 are hereinafter referred to as the bottom portions of the fins 164, 174. The first fins 160 including the upper portions of the fins 162, the insulator layer 120, and the bottom portions of the fins 164 are formed on an N-type metal-oxide-semiconductor (NMOS) region of the first semiconductor substrate 100. The second fins 170 including the upper portions of the fins 172 and the bottom portions of the fins 174 are formed on a P-type metal-oxide-semiconductor (PMOS) region of the first semiconductor substrate 100.

In some embodiments, each of the first fins 160 includes the bottom portion of the fin 164 connected to the P-type well 104, the upper portion of the fin 162 over the P-type well 104, and the insulator layer 120 interconnecting the upper and bottom portions of the fins 162, 164. The bottom portion of the fin 164 is a portion of the first semiconductor substrate 100, and the upper portion of the fin 162 is a portion of the second semiconductor substrate 110 (see FIG. 9).

In some embodiments, each of the second fins 170 includes the bottom portion of the fin 174 connected to the N-type well 106 and the upper portion of the fin 172 connected to the bottom portion of the fin 174. The bottom portion of the fin 174 is a portion of the first semiconductor substrate 100, and the upper portion of the fin 172 is a portion of the epitaxy layer 130 (see FIG. 9).

The second etching process can be similar to the first etching process. That is, the gas utilized in the second etching process is chlorine-based and has high selectivity between silicon and silicon oxide.

In some embodiments, the process gas of the second etching process includes $Cl_2$ and HBr. The flow rate of $Cl_2$ is in a range from about 100 sccm to about 300 sccm, and the flow rate of HBr is in a range from about 50 sccm to about 150 sccm. In some embodiments, a ratio of the flow rate of $Cl_2$ to the flow rate of HBr is in a range from about 2:1 to about 5:1. If the ratio of the flow rate of $Cl_2$ to the flow rate of HBr is outside this range, profiles of the bottom portions of the fins 164, 174 might be unsatisfactory.

The temperature of the second etching process is in a range from about 100 degrees Celsius to about 200 degrees Celsius. If the temperature of the second etching process is greater than about 200 degrees Celsius, the etching rate of the second etching process might be too high, and thus an etching selectivity between the first semiconductor substrate 100 and the hard mask features 150' might be unsatisfactory. If the temperature of the second etching process is lower than about 100 degrees Celsius, the etching rate of the second etching process might be too low, and thus side surfaces of the bottom portions of the fins 164, 174 might not be straight enough.

In some embodiments, the RF power of the second etching process is in a range from about 300 watts to about 500 watts. If the RF power of the second etching process is greater than about 500 watts, the etching rate of the second etching process might be too high, and thus an etching selectivity between the first semiconductor substrate 100 and the hard mask features 150' might be unsatisfactory. If the RF power of the second etching process is lower than about 300 watts, the etching rate of the second etching process might be too low, and thus the side surfaces of the bottom portions of the fins 164, 174 might not be straight enough.

The chemical utilized in the first and second etching processes for forming the fins 160, 170 has a higher etching rate on silicon than it does on silicon oxide. The chemical utilized in the plasma bombardment is different from that utilized in the first and second etching processes and has a higher etching rate on silicon oxide than it does on silicon. As described above, the chemical utilized in the plasma bombardment to break through the insulator layer 120 is a fluorine-based chemical, such as $CF_4/HCF_3/O_2$, and the chemical utilized in the first and second etching processes of patterning the fins 160, 170 is a chlorine-based chemical, such as $Cl_2$/HBr.

As discussed above, the fins 160, 170 are formed by the first and second etching processes, and a plasma bombardment is performed to break through the insulator layer 120 between the first and second etching processes. The side surfaces of the fins 160, 170 can be protected by the protection layer 180 during the plasma bombardment, and thus the profiles of the fins 160, 170 can be protected. The loading at the N-type region and the P-type region can be satisfactorily balanced, and the etching bias can be improved accordingly. For example, the etching depth between the first fins 160 is labeled as depth d1, the etching depth between the second fins 170 is labeled as depth d2, and the loading at the N-type region and the P-type region, e.g. (d2−d1)/d1, is in a range from about 10% to about 20%.

After the first fins 160 and the second fins 170 are formed on the first semiconductor substrate 100, a cleaning process, such as a pre-cleaning process using a diluted HF solution, is performed to remove the remaining protection layer 180 (see FIG. 13). In some embodiments, because the protection layer 180 (see FIG. 13) is removed from the side surfaces of the upper portions of the fins 162, 172, the width W1 of the upper portions of the fins 162 is smaller than the width W2 of the bottom portions of the fins 164, and the width W3 of the upper portions of the fins 172 is smaller than the width W4 of the bottom portions of the fins 174. In some embodiments, the device is soaked in the diluted HF solution for a short period, for example, in a range from about 1 second to about 10 seconds, and hence the insulator layer 120 would not be overly consumed and still remains between the upper and bottom portions of the fins 162, 164 after the protection layer 180 are removed. If the device is soaked in the diluted HF solution for more than about 10 seconds, the upper portions of the fins 162, 172 may be consumed and the fin width may be reduced. If the device is soaked in the diluted HF solution for less than about 1 second, the protection layer 180 cannot be removed from the side surfaces of the upper portions of the fins 162, 172.

The difference between the width W1 of the upper portions of the fins 162 and the width W2 of the bottom portions of the fins 164 or between the width W3 of the upper portions of the fins 172 and the width W4 of the bottom portions of the fins 174 is caused by the thickness of the protection layer 180. In some embodiments, the thickness of the protection layer 180 is in a range from about 1 nm to about 3 nm. If the thickness of the protection layer 180 is greater than about 3 nm, the protection layer 180 might not be removed by the plasma bombardment. On the other hand, if the thickness of the protection layer 180 is smaller than about 1 nm, the protection layer 180 cannot protect the first fins 160 and the second fins 170 during the plasma bombardment, and lead to rough fin side surfaces or fin loss.

Figure 15:
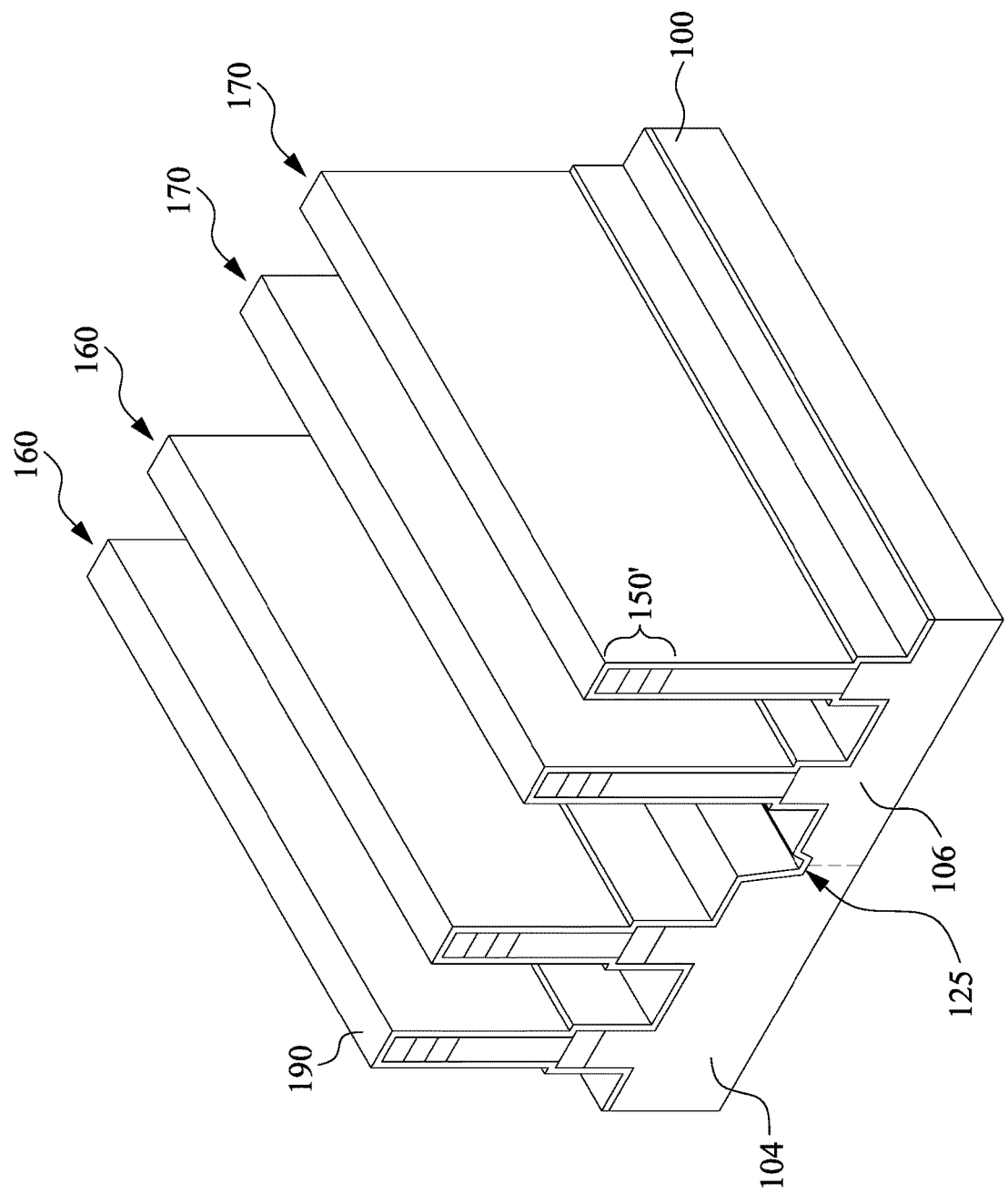

Reference is made to FIG. 15. The semiconductor structure now includes the first fins 160 on the P-type well 104 and the second fins 170 on the N-type well 106. The first fins 160 are utilized to form N-type FinFET devices, and the second fins 170 are utilized to form P-type FinFET devices. In some embodiments, the notch 125 remains in the first semiconductor substrate 100 and between the first fins 160 and the second fins 170 after the second etching process.

A liner 190 is formed over top and side surfaces of the first and second fins 160, 170 and the top surface of the first semiconductor substrate 100. The structure after forming the liner 190 is shown in FIG. 15. The liner 190 can be formed by any suitable material and deposition process. In some embodiments, the liner 190 is a silicon liner.

Figure 16:
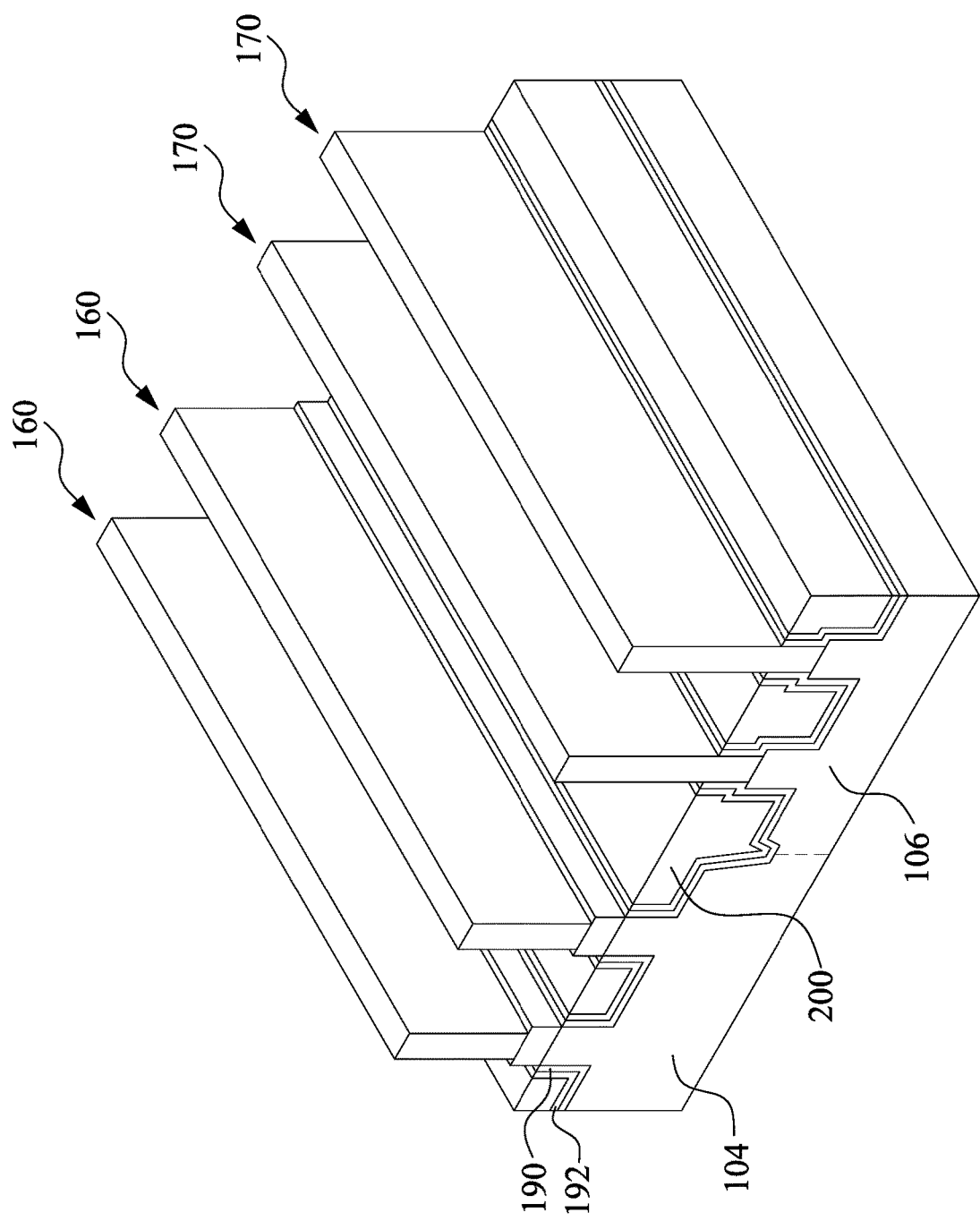

Reference is now made to FIG. 16. In some embodiments, a silicon nitride liner 192 is deposited over the silicon liner 190. A dielectric material is deposited and fills spaces between the first fins 160 and second fins 170. The silicon nitride liner 192 can prevent the second fins 170 from being oxidized during deposition of the dielectric material. Then, a CMP process and a recessing process are performed to form a plurality of isolation structures 200 between the first fins 160 and the second fins 170. In some embodiments, the isolation structures 200 are shallow trench isolations (STI). The isolation structures 200 are made of a dielectric material, such as silicon oxide, silicon nitride, silicon oxynitride, fluoride-doped silicate glass (FSG), a low-k dielectric material, and/or other suitable insulating material. The isolation structures 200 can also be formed by depositing an enhanced gap fill layer using a multi-step deposition and treatment process to eliminate voids and seams in the gap fill material.

In some embodiments, portions of the silicon nitride liner 192 and the silicon liner 190 are removed during the recessing process, such that the first fins 160 and the second fins 170 above the isolation structures 200 are not covered by the silicon nitride liner 192 and the silicon liner 190. The first fins 160 are formed on the P-type well 104 and can be utilized for N-type FinFET devices. The second fins 170 are formed on the N-type well 106 and can be utilized for P-type FinFET devices.

Figure 17:
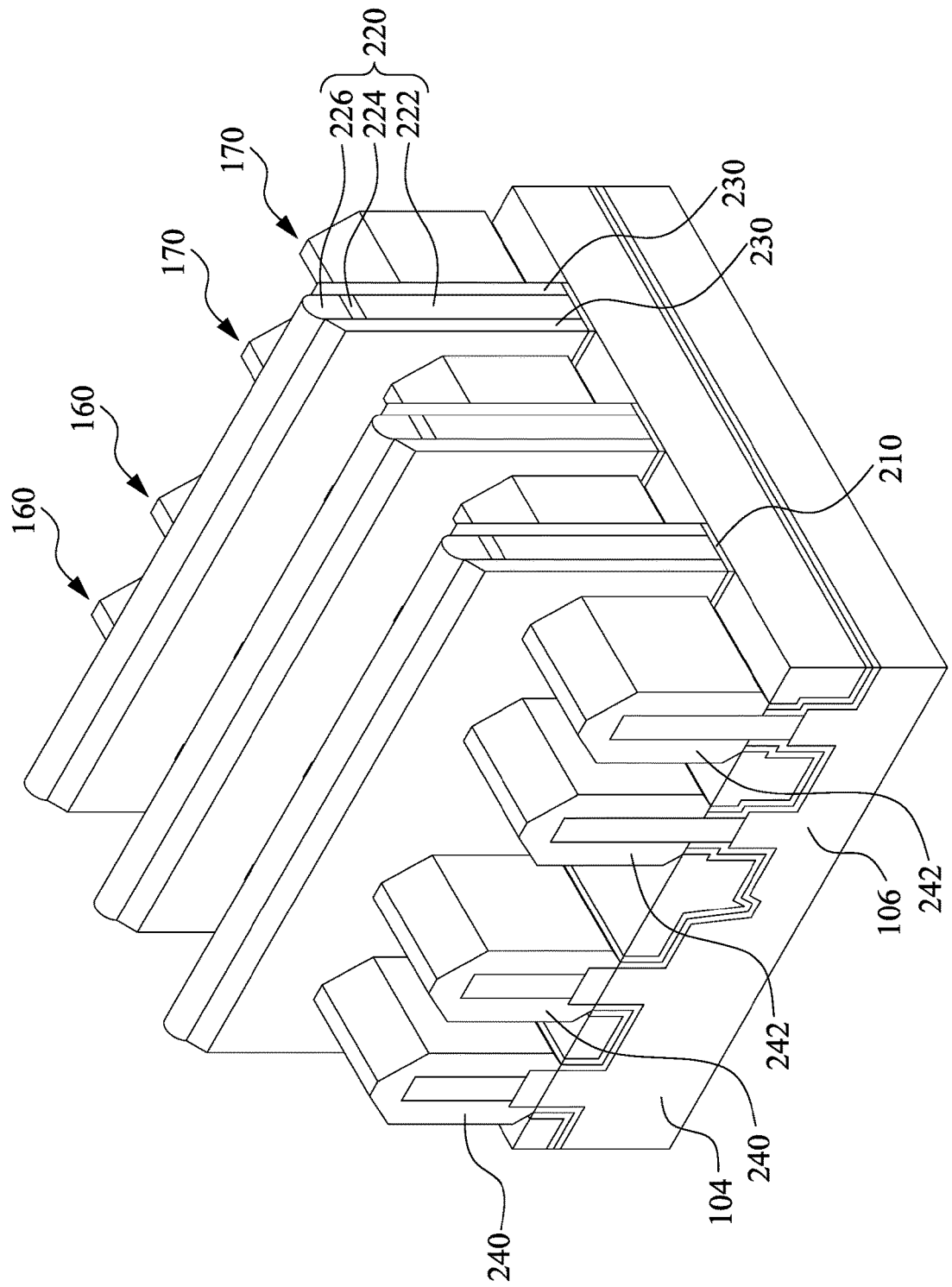

Reference is made to FIG. 17. A gate dielectric layer 210 is formed on the first fins 160 and the second fins 170 through a blanket deposition. In some embodiments, the gate dielectric layer 210 includes silicon oxide, a high-k dielectric material, other suitable dielectric materials, or combinations thereof. In some embodiments, the gate dielectric layer 210 may include a plurality of dielectric layers. In some embodiments, the gate dielectric layer 210 is deposited using an ALD process or a chemical vapor deposition (CVD) process.

Further, dummy gate stacks 220 can be formed in substantially parallel with each other and extend substantially along a direction that is different from the direction of the first fins 160 and the second fins 170. The dummy gate stacks 220 can be uniformly spaced to provide a uniform pattern density. In some embodiments, the dummy gate stacks 220 include dummy gate structures 222. In some embodiments, the dummy gate stacks 220 further include oxide hard masks 224 and nitride hard masks 226 sequentially formed on the dummy gate structures 222. In some embodiments, the dummy gate structures 222 are made of polycrystalline silicon, the oxide hard masks 224 are made of silicon oxide, and the nitride hard masks 226 are made of silicon nitride (SiNx) or silicon carbon nitride (SiCN).

As shown in FIG. 17, sidewall spacers 230 are formed on both side surfaces of each of the dummy gate structures 220. Each sidewall spacer 230 is a low-k spacer with a dielectric constant less than about 4. In some embodiments, each sidewall spacer 230 includes elements such as, for example, silicon (Si), oxygen (O), and carbon (C). In some embodiments, forming each sidewall spacer 230 includes a blanket deposition of a spacer layer followed by anisotropic etching the spacer layer. In some embodiments, anisotropic etching the spacer layer removes the spacer layer over the top surface of the dummy gate structures 220, over the first and second fins 160, 170 and over the isolation structures 200. After anisotropic etching the spacer layer, the sidewall spacers 230 remain on the side surfaces of the dummy gate structures 220.

The gate dielectric layer 210 not covered by the dummy gate structures 220 and the sidewall spacers 230 is removed to expose the underlying first fins 160 and the second fins 170. In some embodiments, a dry etching process can be used to remove the uncovered gate dielectric layer 210.

After the uncovered gate dielectric layer 210 has been removed, epitaxial source/drains 240, 242 are formed on the first fins 160 and the second fins 170. In some embodiments, the epitaxial source/drains 240, 242 are formed by growing epitaxial layers over the exposed surfaces of the first fins 160 and the second fins 170. Growing the epitaxy layers on the exposed surfaces of the first fins 160 and the second fins 170 includes performing a pre-clean process to remove native oxide on the surfaces of the first fins 160 and the second fins 170. Next, an epitaxy process is performed to grow the epitaxy source/drains 240, 242 on the surfaces of the first fins 160 and the second fins 170. Since the lattice constant of the epitaxial source/drains 240, 242 is different from the first fins 160 and the second fins 170, the channel regions of the first fins 160 and the second fins 170 are strained or stressed to enhance carrier mobility of the device and the device performance. The source/drain regions are portions of the first fins 160 and the second fins 170 not covered by the dummy gate structures 220, and the channel regions are portions of the first fins 160 and the second fins 170 covered by the dummy gate structures 220.

In some embodiments, the growth of the epitaxial source/drains 240, 242 over the first fins 160 and the second fins 170 continues until the epitaxial source/drains 240, 242 vertically extend above and laterally extend from the first fins 160 and the second fins 170. In some embodiments, the epitaxial source/drains 240, 242 may include a single layer or a multilayer structure. In the single layer embodiment, the epitaxial source/drains 240, 242 may include a siliconcontaining material. In some embodiments, the epitaxial source/drains 240 include silicon carbon (SiC) and are epi-grown by a low-pressure CVD (LPCVD) process. The LPCVD process is performed at a temperature in a range from about 400 degrees Celsius to about 800 degrees Celsius and under a pressure in a range from about 1 Torr to about 200 Torr using $Si_3H_8$ and $SiH_3CH$ as reaction gases. In some embodiments, the epitaxial source/drains 242 include silicon germanium (SiGe) and are epi-grown by an LPCVD process. The LPCVD process is performed at a temperature in a range from about 400 degrees Celsius to about 800 degrees Celsius and under a pressure in a range from about 1 Torr to about 200 Torr using $SiH_4$ and $GeH_4$ as reaction gases.

Figure 18:
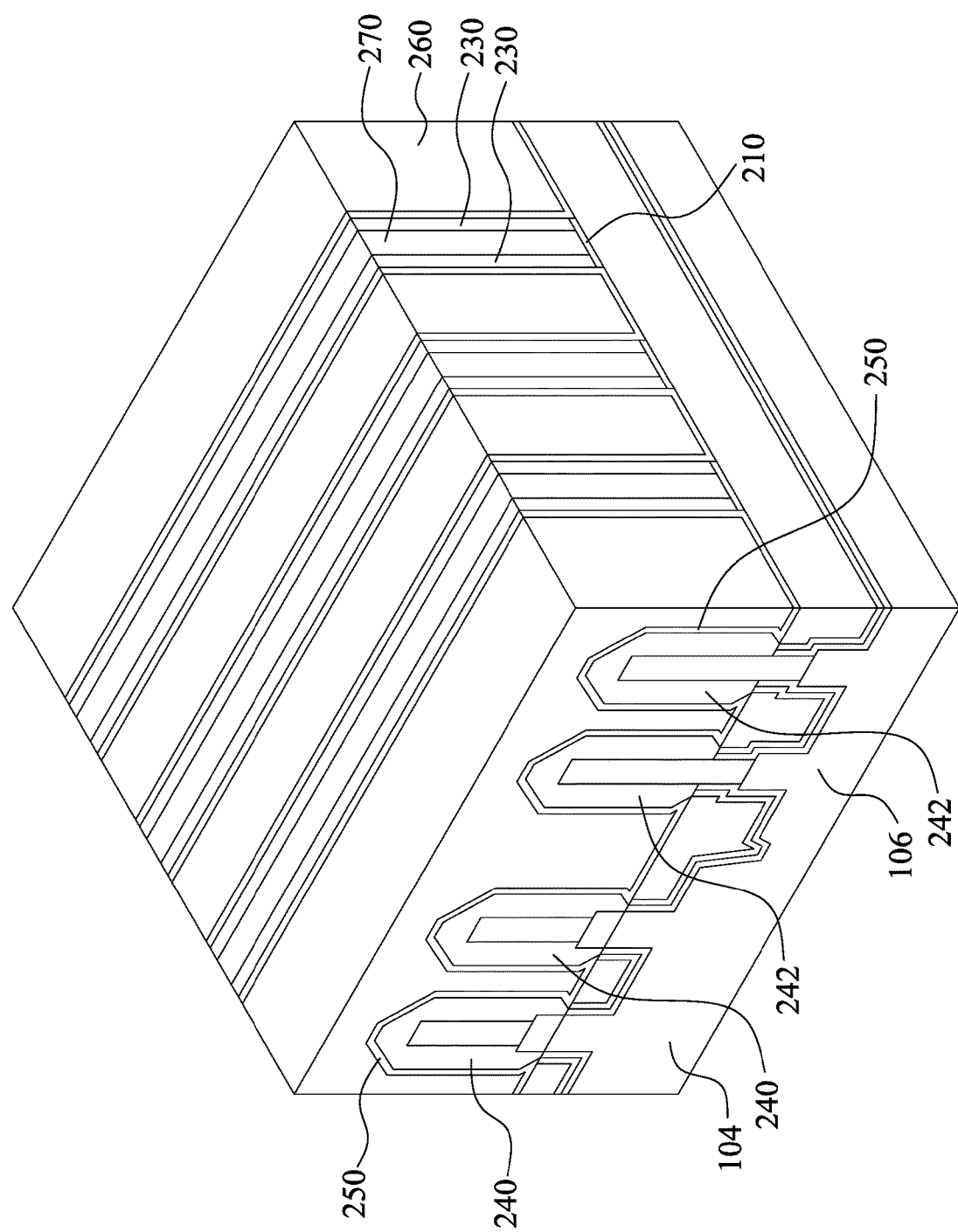

Reference is now made to both FIG. 17 and FIG. 18. A contact etch stop layer 250 is deposited over the epitaxial source/drains 240, 242, the dummy gate structures 220, and the isolation structures 200. In some embodiments, the contact etch stop layer 250 can act as an etch stop layer for the subsequent contact etch so that the epitaxial source/drains 240, 242 below the contact etch stop layer 250 are not damaged by the contact etch. In some embodiments, the contact etch stop layer 250 is a silicon nitride layer. In some embodiments, depositing the contact etch stop layer 250 is performed using an ALD process, a CVD process, other suitable processes, and/or combinations thereof.

An interlayer dielectric layer 260 is formed using a blanket deposition. A planarization process is performed to remove the excess interlayer dielectric layer 260 and contact etch stop layer 250 that are formed over the top surfaces of the dummy gate structures 220. In some embodiments, the interlayer dielectric layer 260 is an oxide layer, such as a silicon oxide layer. In some embodiments, the interlayer dielectric layer 260 is deposited using a CVD process, an ALD process, a flowable (FCVD) process, a spin-on process, other suitable processes, and/or combinations thereof. In some embodiments, an anneal process is performed at a temperature in a range from about 400 degrees Celsius to about 600 degrees Celsius to densify the interlayer dielectric layer 260. In some embodiments, after depositing the interlayer dielectric layer 260, a planarization process (e.g., CMP) is performed to remove portions of the interlayer dielectric layer 260 and the contact etch stop layer 250 that are formed over the top surfaces of the dummy gate structures 220. The planarization process can be performed until the dummy gate structures 222 are exposed. The oxide hard masks 224 and the nitride hard masks 226 are removed during the planarization process.

Then, the dummy gate structures 222 are replaced by metal gate structures 270. The dummy gate structures 222 are removed to form trenches using a dry etching process, a wet etching process, or combinations thereof. Then, the metal gate structures 270 are deposited into the trenches. In some embodiments, the etching process used to remove the dummy gate structures 222 is selective such that the interlayer dielectric layer 260 and the sidewall spacers 230 remain after the etching process.

In some embodiments, the gate dielectric layer 210 remains after removing the dummy gate structures 222, and hence the gate dielectric layer 210 is under the metal gate structures 270 as shown in FIG. 18. In some other embodiments, the gate dielectric layer 210 is removed after removing the dummy gate structures 222, and then a second gate dielectric layer is formed in the trenches before forming the metal gate structures 270 in the trenches. In some other embodiments, the second gate dielectric layer is formed over the gate dielectric layer 210. In some embodiments, the second gate dielectric layer includes an interfacial layer and a high-k dielectric layer. In some embodiments, the interfacial layer is a silicon oxide layer. In some embodiments, the high-k dielectric layer includes a high-k dielectric material such as, for example, hafnium oxide, lanthanum oxide, aluminum oxide, zirconium oxide, silicon nitride, or other suitable high-k materials. In some embodiments, the dielectric constant of the high-k dielectric layer is higher than about 3.9. In some embodiments, the dielectric constant of the high-k dielectric layer is higher than about 7. In some embodiments, forming the second gate dielectric layer is performed using an ALD process, a CVD process, other suitable deposition processes, and/or combinations thereof.

In some embodiments, the metal gate structures 270 include a metal conductor such as, for example, tungsten (W), titanium (Ti), tantalum (Ta), copper (Cu), molybdenum (Mo), other suitable metals or metal alloys, or combinations thereof. In some embodiments, the metal gate structures 270 also include a diffusion barrier such as, for example, titanium nitride (TiN), titanium silicon nitride (TiSiN), other suitable metals or metal alloys, or combinations thereof. In some embodiments, the metal gate structures 270 further include a work-function metal such as, for example, TiN, titanium aluminum (TiAl), other suitable metals or metal alloys, or combinations thereof for N-type FinFET devices or tantalum nitride (TaN), TiAl, other suitable metals or metal alloys, or combinations thereof for P-type FinFET devices. In some embodiments, forming the metal electrodes 270 can be performed using a physical vapor deposition (PVD) process, an ALD process, a CVD process, other suitable deposition processes, and/or combinations thereof.

In some embodiments, after forming metal gate structures 270 in the trenches, a planarization process (e.g., a CMP process) is performed to planarize the top surfaces of the semiconductor structure. In some embodiments, the planarization process continues until the top surfaces of the interlayer dielectric layer 260 and the metal gate structures 270 are substantially coplanar.

Figure 22:
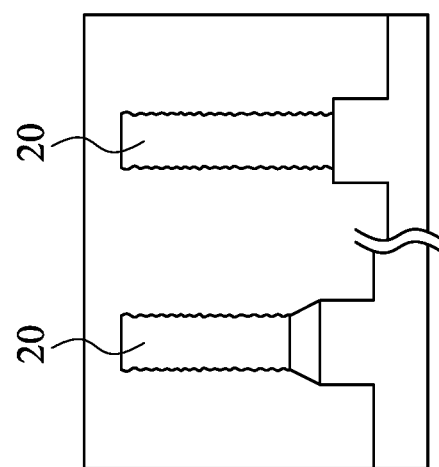
FIG. 21 and FIG. 22 are schematic views of fins fabricated by different etching processes according to various embodiments of the present disclosure.
Figure 21:
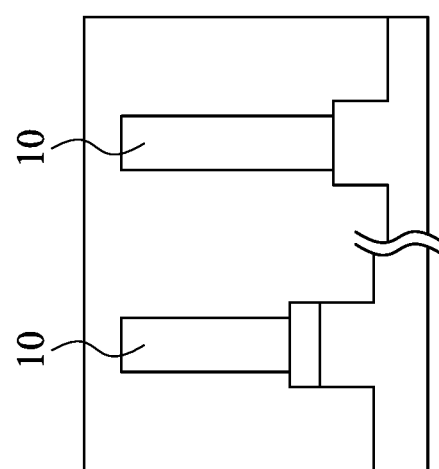

Reference is made to FIG. 21 and FIG. 22, in which FIG. 21 and FIG. 22 are schematic views of fins fabricated by different etching processes according to different embodiments of the present disclosure. FIG. 21 shows fins 10 that are made by using the protection layer 180 (see FIG. 13) to protect side surfaces of the fins 10 during the plasma bombardment process shown in FIG. 13, and FIG. 20 shows fins 20 that are made without using the protection layer. The fins 10 fabricated by using the protection layer 180 (see FIG. 13) have smooth side surfaces because the protection layer 180 (see FIG. 13) can protect the side surfaces of the fins 10 during the plasma bombardment process shown in FIG. 13. On the other hands, the fins 20 fabricated without using the protection layer have rough side surfaces.

As described above, the fins are formed by two-step etching, and a plasma bombardment is introduced to break through the insulator layer. A protection layer is form over the fins prior to the plasma bombardment. This protection layer can protect the side surfaces of the fins during the plasma bombardment, such that the side surfaces of the fins after the plasma bombardment are smooth.

According to some embodiments of the disclosure, a method includes bonding a first semiconductor substrate onto a second semiconductor substrate with an insulator layer between the first semiconductor substrate and the second semiconductor substrate, and etching the first semiconductor substrate to formed an upper portion of a fin, in which a first portion of the insulator layer is exposed by etching the first semiconductor substrate. A protection layer is deposited over the upper portion of the fin and over a top surface of the first portion of the insulator layer using an atomic layer deposition process. First portions of the protection layer over a top surface of the upper portion of the fin and the top surface of the first portion of the insulator layer are etched, in which a second portion of the protection layer remains on a side surface of the upper portion of the fin. The first portion of the insulator layer is etched, in which a second portion of the insulator layer remains under the upper portion of the fin. The second semiconductor substrate is etched to form a bottom portion of the fin under the second portion of the insulator layer.

According to some embodiments of the disclosure, a method includes bonding a first semiconductor substrate onto a second semiconductor substrate with an insulator layer between the first semiconductor substrate and the second semiconductor substrate, and etching a first portion of the first semiconductor substrate and a first portion of the insulator layer until the second semiconductor substrate is exposed. A second portion of the first semiconductor substrate and a second portion of the insulator layer remain over the second semiconductor substrate. An epitaxy layer is epitaxially growing over the second semiconductor substrate. The second portion of the first semiconductor substrate is etched to form an upper portion of a first fin. The epitaxy layer is etched to form an upper portion of a second fin. A first sub-portion of the second portion the insulator layer is exposed by etching the second portion of the first semiconductor substrate. A protection layer is deposited over the upper portion of the second fin using an atomic layer deposition process. The first sub-portion of the second portion of the insulator layer is etched, in which a second sub-portion of the second portion of the insulator layer remains under the upper portion of the first fin. The second semiconductor substrate is etched to form a bottom portion of the first fin under the second sub-portion of the second portion of the insulator layer and a bottom portion of the second fin under the upper portion of the second fin.

According to some embodiments of the disclosure, a device includes a semiconductor substrate, a first fin over the semiconductor substrate, and an isolation structure. The first fin includes an upper portion, a bottom portion, and an insulator layer between the upper portion and the bottom portion, in which a top surface of the insulator layer is wider than a bottom surface of the upper portion of the first fin. The isolation structure surrounds the bottom portion of the first fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
bonding a first semiconductor substrate onto a second semiconductor substrate with an insulator layer between the first semiconductor substrate and the second semiconductor substrate;
etching the first semiconductor substrate to form an upper portion of a fin, wherein a first portion of the insulator layer is exposed by etching the first semiconductor substrate;
depositing a protection layer over the upper portion of the fin and over a top surface of the first portion of the insulator layer using an atomic layer deposition process;
etching first portions of the protection layer over a top surface of the upper portion of the fin and the top surface of the first portion of the insulator layer, wherein a second portion of the protection layer remains on a side surface of the upper portion of the fin;
etching the first portion of the insulator layer, wherein a second portion of the insulator layer remains under the upper portion of the fin; and
etching the second semiconductor substrate to form a bottom portion of the fin under the second portion of the insulator layer.

2. The method of claim 1, further comprising:
etching the second portion of the protection layer.

3. The method of claim 1, wherein etching the first semiconductor substrate and etching the first portion of the insulator layer use different etchants.

4. The method of claim 1, wherein etching the first semiconductor substrate uses a chlorine-based etchant.

5. The method of claim 1, wherein etching the first portion of the insulator layer uses a fluorine-based etchant.

6. The method of claim 1, wherein etching the first portion of the insulator layer and etching the second semiconductor substrate use different etchants.

7. The method of claim 1, wherein etching the second semiconductor substrate uses a chlorine-based etchant.

8. The method of claim 1, wherein the protection layer has a thickness in a range from about 2 nm to about 3 nm.

9. A method, comprising:
bonding a first semiconductor substrate onto a second semiconductor substrate with an insulator layer between the first semiconductor substrate and the second semiconductor substrate;
etching a first portion of the first semiconductor substrate and a first portion of the insulator layer until the second semiconductor substrate is exposed, wherein a second portion of the first semiconductor substrate and a second portion of the insulator layer remain over the second semiconductor substrate;
epitaxially growing an epitaxy layer over the second semiconductor substrate;
etching the second portion of the first semiconductor substrate to form an upper portion of a first fin and etching the epitaxy layer to form an upper portion of a second fin, wherein a first sub-portion of the second portion the insulator layer is exposed by etching the second portion of the first semiconductor substrate;
depositing a protection layer over the upper portion of the second fin using an atomic layer deposition process;
etching the first sub-portion of the second portion of the insulator layer, wherein a second sub-portion of the second portion of the insulator layer remains under the upper portion of the first fin; and
etching the second semiconductor substrate to form a bottom portion of the first fin under the second sub-portion of the second portion of the insulator layer and a bottom portion of the second fin under the upper portion of the second fin.

10. The method of claim 9, further comprising:
removing the protection layer from the upper portion of the second fin.

11. The method of claim 9, wherein etching the epitaxy layer and etching the first sub-portion of the second portion of the insulator layer use different etchants.

12. The method of claim 9, wherein depositing the protection layer is performed such that the protection layer is deposited over the upper portion of the first fin.

13. The method of claim 9, wherein etching the first sub-portion of the second portion of the insulator layer is performed using plasma bombardment.

14. A method, comprising:
forming a P-type well and an N-type well in a first substrate;
bonding a second substrate onto the first substrate with an oxide layer between the first substrate and the second substrate;
patterning the second substrate into a patterned second substrate over the P-type well, and the oxide layer into a patterned oxide layer vertically between the P-type well and the patterned second substrate;
after patterning the second substrate and the oxide layer, epitaxially growing an epitaxy layer from the N-type well;
patterning the patterned second substrate into upper portions of first fins and the epitaxy layer into upper portions of second fins;
forming a protection layer over the upper portions of the first fins and the upper portions of the second fins;
performing a plasma etching process on the protection layer until the patterned oxide layer is broken into separate oxide strips; and
patterning the first substrate within the P-type well into bottom portions of the first fins using the oxide strips as an etch mask.

15. The method of claim 14, further comprising:
after patterning the first substrate within the P-type well, removing the protection layer from side surfaces of the upper portions of the first fins.

16. The method of claim 14, further comprising:
after patterning the first substrate within the P-type well, removing the protection layer from side surfaces of the upper portions of the second fins.

17. The method of claim 14, further comprising:
patterning the first substrate within the N-type well into bottom portions of the second fins.

18. The method of claim 17, wherein patterning the first substrate within the N-type well is performed simultaneously with patterning the first substrate within the P-type well.

19. The method of claim 14, wherein the plasma etching process uses a different chemistry than that of patterning the second substrate.

20. The method of claim 14, wherein the plasma etching process uses a fluorine-based chemistry.

* * * * *